US 11,802,239 B2

United States Patent
Ko et al.

(10) Patent No.: US 11,802,239 B2
(45) Date of Patent: Oct. 31, 2023

(54) QUANTUM DOT, METHOD OF PREPARING QUANTUM DOT, OPTICAL MEMBER INCLUDING QUANTUM DOT, AND ELECTRONIC DEVICE INCLUDING QUANTUM DOT

(71) Applicants: Samsung Display Co., Ltd., Yongin-si (KR); Hongik University Industry-Academia Cooperation Foundation, Seoul (KR)

(72) Inventors: Yunhyuk Ko, Yongin-si (KR); Heesun Yang, Seoul (KR); Changhee Lee, Yongin-si (KR); Kyunghye Kim, Seoul (KR); Sungwoon Kim, Yongin-si (KR); Jungho Jo, Seoul (KR)

(73) Assignees: SAMSUNG DISPLAY CO., LTD., Yongin-si (KR); HONGIK UNIVERSITY INDUSTRY-ACADEMIA COOPERATION FOUNDATION, Seoul (KR)

( * ) Notice: Subject to any disclaimer, the term of this patent is extended or adjusted under 35 U.S.C. 154(b) by 206 days.

(21) Appl. No.: 17/203,538

(22) Filed: Mar. 16, 2021

(65) Prior Publication Data
US 2021/0301202 A1 Sep. 30, 2021

(30) Foreign Application Priority Data

Mar. 21, 2020 (KR) .................. 10-2020-0039263
Jan. 6, 2021 (KR) .................. 10-2021-0001472

(51) Int. Cl.
*C09K 11/62* (2006.01)
*C09K 11/70* (2006.01)
(Continued)

(52) U.S. Cl.
CPC ............ *C09K 11/626* (2013.01); *C01B 19/04* (2013.01); *C01G 9/08* (2013.01); *C01G 15/006* (2013.01);
(Continued)

(58) Field of Classification Search
CPC ... C09K 11/62; C09K 11/0883; C09K 11/562; C09K 11/70; C09K 11/706; C09K 11/74;
(Continued)

(56) References Cited

U.S. PATENT DOCUMENTS

2013/0092883 A1* 4/2013 Kahen .................. C09K 11/883
  977/773
2018/0327664 A1* 11/2018 Houtepen .............. C09K 11/62
(Continued)

FOREIGN PATENT DOCUMENTS

KR 10-2015-0111307 10/2015
KR 10-2016-0120359 10/2016
(Continued)

OTHER PUBLICATIONS

Kim et al., "Cation-Exchange-Derived InGaP Alloy Quantum Dots toward Blue Emissivity", Feb. 9, 2020, Chemistry of Materials, 32, pp. 3537-3544. (Year: 2020).*
(Continued)

*Primary Examiner* — Matthew E. Hoban
*Assistant Examiner* — Lynne Edmondson
(74) *Attorney, Agent, or Firm* — KILE PARK REED & HOUTTEMAN PLLC

(57) ABSTRACT

Provided are a quantum dot, a method of preparing the quantum dot, an optical member including the quantum dot, and an electronic device including the quantum dot. The quantum dot includes a core including indium (In), $A^1$, and $A^2$; and a shell covering the core. $A^1$ is a Group V element, $A^2$ is a Group III element other than indium, and the core
(Continued)

includes a first region, and a second region covering the first region. The first region does not include $A^2$, and includes indium and $A^1$, and the second region includes indium, $A^1$, and $A^2$, and indium and $A^2$ are alloyed with each other in the second region.

19 Claims, 7 Drawing Sheets

(51) Int. Cl.
       *C09K 11/08*        (2006.01)
       *C09K 11/56*        (2006.01)
       *C01G 15/00*        (2006.01)
       *H05B 33/14*        (2006.01)
       *C01G 9/08*         (2006.01)
       *C01B 19/04*        (2006.01)
       *H10K 50/115*      (2023.01)
       *B82Y 20/00*        (2011.01)
       *B82Y 30/00*        (2011.01)
       *B82Y 40/00*        (2011.01)
       *H10K 102/00*      (2023.01)

(52) U.S. Cl.
    CPC ........ *C09K 11/0883* (2013.01); *C09K 11/565* (2013.01); *C09K 11/70* (2013.01); *H05B 33/14* (2013.01); *H10K 50/115* (2023.02); *B82Y 20/00* (2013.01); *B82Y 30/00* (2013.01); *B82Y 40/00* (2013.01); *C01P 2004/64* (2013.01); *C01P 2006/60* (2013.01); *H10K 2102/00* (2023.02)

(58) Field of Classification Search
    CPC ..... C09K 11/7492; C09K 11/75; C09K 11/76; C09K 11/02; C09K 11/025; C09K 11/08; C01G 15/00; C01G 15/003; C01G 15/006; H01L 51/502; H01L 51/504; H05B 33/14; C01P 2004/64; C01P 2004/84; B82Y 20/00; B82Y 40/00
    See application file for complete search history.

(56) References Cited

U.S. PATENT DOCUMENTS

2019/0027562 A1    1/2019    Wada et al.
2020/0347295 A1    11/2020   Curley et al.

FOREIGN PATENT DOCUMENTS

| KR | 10-2017-0025028 | 3/2017 |
|---|---|---|
| KR | 10-1739751 | 5/2017 |
| KR | 10-2018-0104010 | 9/2018 |
| WO | 2017/169932 | 10/2017 |

OTHER PUBLICATIONS

Francesca Pietra et al., "Ga for Zn Cation Exchange Allows for Highly Luminescent and Photostable InZnP based Quantum Dots", Chemistry of Materials, Jun. 6, 2017, pp. 1-29.
Vishwas Srivastava et al., "Colloidal Chemistry in Molten Salts: Synthesis of luminescent InGaP and InGaAs Quantum Dots", Journal of the American Chemical Society, Aug. 20, 2018, pp. 1-28.
K. David Wegner et al., "Gallium—a versatile element for tuning the photoluminescence properties of InP quantum dots", ChemComm, Jan. 11, 2019.
Misung Kim et al., "Highly Luminescent and Stable Green-emitting In(Zn,Ga)P/ZnSeS/ZnS Small-core/Thick-multishell Quantum Dots", Journal of Luminescence, Oct. 10, 2018.
Ki-Heon Lee et al., "Highly Efficient, Color-Pure, Color-Stable Blue Quantum Dot Light-Emitting Devices", ACS Nano, Jul. 15, 2013, www.acsnano.org.
Aqiang Wang et al., "Bright, Efficient, and Color-stable Violet ZnSe-Based Quantum Dots Light-Emitting Diodes", Nanoscale, Jan. 5, 2015, pp. 1-21.
Kipil Lim et al., "Synthesis of blue emitting InP/ZnS quantum dots through control of competition between etching and growth", Nanotechnology, Nov. 9, 2012, p. 1-7, vol. 23, No. 485609.
Sungwoo Kim et al., "Highly Luminescent InP/GaP/ZnS Nanocrystals and Their Application to White Light-Emitting Diodes", Journal of the American Society, Feb. 3, 2012, pp. 3804-3809, vol. 134.
Han Zhang et al., "High-Brightness Blue InP Quantum Dot-Based Electroluminescent Devices: The Role of Shell Thickness", The Journal of Physical Chemistry Letters, Jan. 18, 2020, pp. 960-967, vol. 11.
International Search Report corresponding to International Application No. PCT/KR2021/003947 dated Jul. 26, 2021.

* cited by examiner

QUANTUM DOT, METHOD OF PREPARING QUANTUM DOT, OPTICAL MEMBER INCLUDING QUANTUM DOT, AND ELECTRONIC DEVICE INCLUDING QUANTUM DOT

CROSS-REFERENCE TO RELATED APPLICATION(S)

This application claims priority to and benefits of Korean Patent Applications Nos. 10-2020-0039263 and 10-2021-0001472 under 35 U.S.C. § 119, filed on Mar. 31, 2020 and Jan. 6, 2021, respectively, in the Korean Intellectual Property Office, the entire contents of which are incorporated herein by reference.

BACKGROUND

1. Technical Field

The disclosure relates to a quantum dot, a method of preparing the quantum dot, an optical member including the quantum dot, and an electronic device including the quantum dot.

2. Description of the Related Art

In optical members and in various electronic devices, quantum dots may be used for various optical functions, such as a light conversion function, a light emission function, and the like. Quantum dots are nanometer-sized semiconductor crystals that exhibit a quantum confinement effect, and may have different energy band gaps by controlling the size and composition of the nanocrystals. Thus, quantum dots enable one to control the emission of light at various emission wavelengths.

An optical member including such quantum dots may have the form of a thin film, such as a thin film patterned for each sub-pixel. Such an optical member may also be used as a color conversion member of a device that includes various light sources.

Quantum dots may be used for various purposes in various electronic devices. For example, quantum dots may also be used as an emitter. To serve as an emitter, quantum dots may be included in an emission layer of a light-emitting element including a pair of electrodes and an emission layer.

In order to implement a high-quality optical member and electronic device, it is necessary to develop quantum dots that emit blue light having a maximum emission wavelength equal to or less than about 490 nm, have an excellent photoluminescence quantum yield (PLQY), and do not contain cadmium, which is a toxic element.

SUMMARY

Provided are novel quantum dot, a method of preparing the quantum dot, an optical member including the quantum dot, and an electronic device including the quantum dot.

Additional aspects will be set forth in part in the description which follows and, in part, will be apparent from the description, or may be learned by practice of the embodiments of the disclosure.

According to an embodiment, a quantum dot may include a core including indium (In), $A^1$, and $A^2$, and a shell covering the core, wherein $A^1$ may be a Group V element, $A^2$ may be a Group III element other than indium, the core may include a first region, and a second region covering the first region, the first region may not include $A^2$, and may include indium and $A^1$, the second region may include indium, $A^1$, and $A^2$, and indium and $A^2$ may be alloyed with each other in the second region.

In an embodiment, $A^1$ may be nitrogen (N), phosphorus (P), arsenic (As), antimony (Sb), bismuth (Bi), or any combination thereof.

In an embodiment, $A^2$ may be boron (B), aluminum (Al), gallium (Ga), thallium (Tl), or any combination thereof.

In an embodiment, the first region may include InN, InP, InAs, InSb, InNP, InNAs, InNSb, InPAs, or InPSb.

In an embodiment, the second region may include InGaN, InGaP, InGaAs, InGaSb, InGaNP, InGaNAs, InGaNSb, InGaPAs, InGaPSb, InAlN, InAlP, InAlAs, InAlSb, InAlNP, InAlNAs, InAlNSb, InAlPAs, InAlPSb, InGaAlN, InGaAlP, InGaAlAs, InGaAlSb, InGaAlNP, InGaAlNAs, InGaAlNSb, InGaAlPAs, or InGaAlPSb.

In an embodiment, $A^2$ may be introduced into the second region by a cation exchange reaction.

In an embodiment, $A^1$ included in the first region may be the same as $A^1$ included in the second region.

In an embodiment, the concentration of $A^2$ included in the second region may have a concentration gradient in which the concentration thereof gradually increases along a direction from an interface between the first region and the second region toward a surface of the core.

In an embodiment, the shell may include a Group III-V semiconductor compound, a Group II-VI semiconductor compound, or any combination thereof.

In an embodiment, the Group III-V semiconductor compound may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and the Group II-VI semiconductor compound may include ZnS, ZnSe, ZnTe, ZnO, MgS, MgSe, ZnSeS, ZnSeTe, ZnSTe, MgZnS, MgZnSe, or any combination thereof.

In an embodiment, the shell may include a first shell covering the core and a second shell covering the first shell. The first shell may include GaP, ZnSe, ZnSeS, or any combination thereof, and the second shell may include ZnS.

In an embodiment, the quantum dot may emit blue light having a maximum emission wavelength in a range of about 400 nm to about 490 nm.

In an embodiment, the core may further include a third region covering the second region, the third region may not include indium, and the third region may include $A^1$ and $A^2$.

According to an embodiment, a method of preparing a quantum dot is provided, wherein the quantum dot may include a core including indium (In), $A^1$ and $A^2$, and a shell covering the core. $A^1$ may be a Group V element, $A^2$ may be a Group III element other than indium, the core may include a first region, and a second region covering the first region, the first region may not include $A^2$, and may include indium and $A^1$, the second region may include indium, $A^1$ and $A^2$, and indium and $A^2$ may be alloyed with each other in the second region. The method may include providing a first particle including indium (In) and $A^1$, forming the core by contacting the first particle with a composition including a $A^2$-containing precursor at a temperature in a range of about 210° C. to about 340° C., and forming the shell covering the core.

In an embodiment, the forming of the core may include forming a second region of the core by a cation exchange reaction in which at least indium cations of the first particle are substituted with $A^2$ cations by contacting the first particle with a composition including an $A^2$-containing precursor.

In an embodiment, the $A^2$-containing precursor may include an $A^2$-containing halogenide, an $A^2$-containing oxide, an $A^2$-containing nitride, an $A^2$-containing antimonide, an $A^2$-containing oxynitride, an $A^2$-containing sulfide, an $A^2$-containing oxyhalogenide, an $A^2$-containing oxyhalogenide hydrate, an $A^2$-containing nitrate, an $A^2$-containing nitrate hydrate, an $A^2$-containing sulfate, an $A^2$-containing sulfate hydrate, an $A^2$-containing amine derivative, an $A^2$-containing hydrocarbon derivative, or any combination thereof.

According to an embodiment, an optical member may include the quantum dot.

According to an embodiment, an electronic device may include the quantum dot.

In an embodiment, the electronic device may include a light source, and a color conversion member disposed in a path of light emitted from the light source. The color conversion member may include the quantum dot.

In an embodiment, the electronic device may include a light-emitting element including a first electrode, a second electrode facing the first electrode, and an emission layer between the first electrode and the second electrode. The light emitting element may include the quantum dot.

BRIEF DESCRIPTION OF THE DRAWINGS

The above and other aspects, features, and advantages of the disclosure will become more apparent by describing in detail embodiments thereof with reference to the accompanying drawings, in which.

DETAILED DESCRIPTION OF THE EMBODIMENTS

Figure 1:
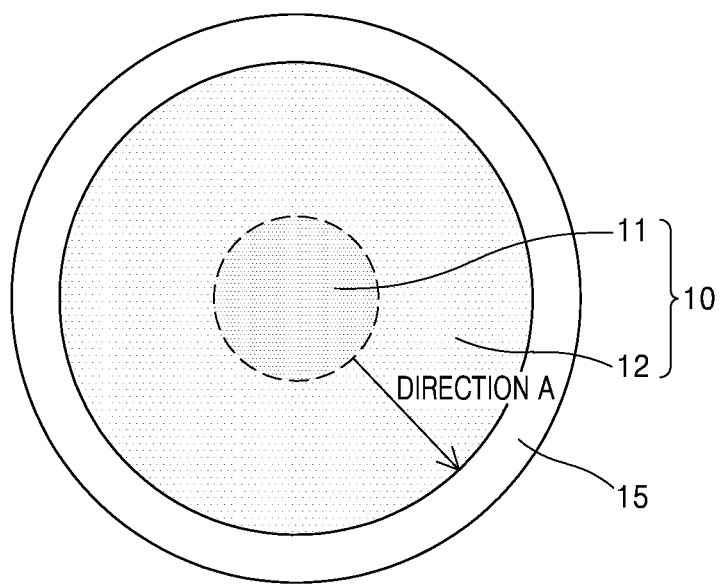
FIG. 1 is a schematic cross-sectional view of a quantum dot according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

It will be understood that, although the terms "first," "second," etc. may be used herein to describe various elements, these elements should not be limited by these terms. These terms are only used to distinguish one element from another element. Thus, a first element could be termed a second element without departing from the teachings of the invention. Similarly, a second element could be termed a first element, without departing from the scope of the embodiments of the inventive concept.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

As used herein, "Group II elements" may include Group IIA elements and Group IIB elements in the IUPAC periodic table, and examples of the Group II elements may include magnesium (Mg), calcium (Ca), zinc (Zn), cadmium (Cd), and mercury (Hg).

As used herein, "Group III elements" may include Group IIIA elements and Group IIIB elements in the IUPAC periodic table, and examples of the Group III elements may include aluminum (Al), gallium (Ga), indium (In), and thallium (Tl).

As used herein, "Group V elements" may include Group VA elements and Group VB elements in the IUPAC periodic table, and examples of the Group V elements may include nitrogen (N), phosphorus (P), arsenic (As), and antimony (Sb).

As used herein, "Group VI elements" may include Group VIA elements and Group VIB elements in the IUPAC periodic table, and examples of the Group VI elements may include sulfur (S), selenium (Se), tellurium (Te).

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

[Description of Quantum Dot 100 Shown in FIG. 1]

FIG. 1 is a schematic cross-sectional view of a quantum dot according to an embodiment. The quantum dot 100 of FIG. 1 includes a core 10 including indium (In), $A^1$, and $A^2$, and a shell 15 covering the core 10. In the quantum dot 100 of FIG. 1, $A^1$ is a Group V element, and $A^2$ is a Group III element other than indium.

According to an embodiment, $A^1$ may be nitrogen (N), phosphorus (P), arsenic (As), antimony (Sb), bismuth (Bi), or any combination thereof.

According to another embodiment, $A^1$ may be nitrogen (N), phosphorus (P), arsenic (As), antimony (Sb), or any combination thereof.

According to an embodiment, $A^2$ may be boron (B), aluminum (Al), gallium (Ga), thallium (Tl), or any combination thereof.

According to another embodiment, $A^2$ may be aluminum (Al), gallium (Ga), or any combination thereof.

The atomic ratio of indium to $A^2$ in the core 10 may be in a range of about 0.01:0.99 to about 0.99:0.01.

The core 10 may include a first region 11, and a second region 12 covering the first region 11.

For example, the first region 11 may be a spherical region having a radius corresponding to a length of 10%, 15%, 20%, 25% or 30% of the total length from the center of the core 10 to the surface of the core 10.

As another example, the second region 12 may be a region other than the first region 11 of the core 10.

The first region 11 of the core 10 may not include $A^2$, and may include indium and $A^1$.

For example, the first region 11 may include (or consist of) InN, InP, InAs, InSb, InNP, InNAs, InNSb, InPAs, or InPSb.

The second region 12 of the core 10 may include indium, $A^1$, and $A^2$, and indium and $A^2$ may be alloyed with each other in the second region 12.

For example, the first region 12 may include (or consist of) InGaN, InGaP, InGaAs, InGaSb, InGaNP, InGaNAs, InGaNSb, InGaPAs, InGaPSb, InAlN, InAlP, InAlAs, InAlSb, InAlNP, InAlNAs, InAlNSb, InAlPAs, InAlPSb, InGaAlN, InGaAlP, InGaAlAs, InGaAlSb, InGaAlNP, InGaAlNAs, InGaAlNSb, InGaAlPAs, or InGaAlPSb.

$A^2$ of the second region 12 may be an element introduced into the second region 12 by a cation exchange reaction. For example, the second region 12 of the core 10 is not formed by first synthesizing the first region 11 and then coating or growing the second region 12 on the surface of the first region 11. Accordingly, the second region 12 is clearly distinguished from the shell 15 formed on the surface of the core 10 by a coating method or a growing method after first synthesizing the core 10. For example, the domain or phase of the first region 11 is continuously connected to the domain or phase of the second region 12, but the domain or phase of the core 10 may be discontinuously separated from the domain or phase of the shell 15. For the method of forming the second region 12 and the like, refer to the quantum dot synthesis method described in this specification.

According to an embodiment, $A^1$ included in the first region 11 may be the same as $A^1$ included in the second region 12.

According to another embodiment, the concentration of $A^2$ included in the second region 12 may have a concentration gradient in which the concentration of $A^2$ gradually increases along a direction from the interface between the first region 11 and the second region 12 toward the surface of the core 10 ("DIRECTION A" in FIG. 1).

An average particle diameter (D50) of the core 10 may be in a range of about 0.1 nm to about 5 nm. For example, the average particle diameter (D50) of the core 10 may be in a range of about 0.5 nm to about 3 nm. For example, the average particle diameter (D50) of the core 10 may be in a range of about 0.8 nm to about 2 nm. When the average particle diameter (D50) of the core 10 is within the above ranges, the quantum dot 100 may emit short wavelength-shifted blue light.

The core 10 may further include other elements in addition to the aforementioned indium, $A^1$, and $A^2$. For example, the core 10 may further include a Group II element (for example, Zn).

The shell 15 may be formed on the surface of the core 10 to serve as a protective layer for preventing the chemical degeneration of the core 10 and for maintaining semiconductor properties and/or to serve as a charging layer for imparting electrophoretic properties to the quantum dot 100.

According to an embodiment, the shell 15 may include a Group III-V semiconductor compound, a Group II-VI semiconductor compound, a Group III-VI semiconductor compound, a Group IV-VI semiconductor compound, a Group semiconductor compound, or any combination thereof.

According to another embodiment, the shell 15 may include a Group III-V semiconductor compound, a Group II-VI semiconductor compound, or any combination thereof.

The Group III-V semiconductor compound may include, for example, a two-element compound such as GaN, GaP, GaAs, GaSb, AlN, AlP, AlAs, AlSb, InN, InP, InAs, or InSb, a three-element compound such as GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, or GaAlNP, a four-element compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb, or any combination thereof. The Group III-V semiconductor compound may further include a Group II element. Examples of the Group III-V semiconductor compound further including a Group II element may include InZnP, InGaZnP, and InAlZnP.

The Group II-VI semiconductor compound may include, for example, a two-element compound such as CdS, CdSe, CdTe, ZnS, ZnSe, ZnTe, ZnO, HgS, HgSe, HgTe, MgSe, or MgS, a three-element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS, a four-element compound such as CdZnSeS, CdZnSeTe, CdZnSTe, CdHgSeS, CdHgSeTe, CdHgSTe, HgZnSeS, HgZnSeTe, HgZnSTe, or any combination thereof.

According to an embodiment, the Group II-VI semiconductor compound may not include Cd and Hg. Accordingly, the Group II-VI semiconductor compound may include, for example, ZnS, ZnSe, ZnTe, ZnO, MgS, MgSe, ZnSeS, ZnSeTe, ZnSTe, MgZnS, MgZnSe, or any combination thereof.

The Group III-VI semiconductor compound may include a two-element compound such as GaS, GaSe, $Ga_2Se_3$, GaTe, InS, InSe, $In_2S_3$, $In_2Se_3$, or InTe; a three-element compound such as $InGaS_3$ or $InGaSe_3$; or any combination thereof.

The group IV-VI semiconductor compound may include a two-element compound such as SnS, SnSe, SnTe, PbS, PbSe, or PbTe, a three-element compound such as SnSeS, SnSeTe, SnSTe, PbSeS, PbSeTe, PbSTe, SnPbS, SnPbSe, or SnPbTe, a four-element compound such as SnPbSSe, SnPbSeTe, or SnPbSTe, or any combination thereof.

The Group semiconductor compound may include, for example, AgInS, $AgInS_2$, CuInS, $CuInS_2$, $CuGaO_2$, $AgGaO_2$, $AgAlO_2$, or any combination thereof.

According to an embodiment, the Group III-V semiconductor compound may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and the group II-VI semiconductor compound may include ZnS, ZnSe, ZnTe, ZnO, MgS, MgSe, ZnSeS, ZnSeTe, ZnSTe, MgZnS, MgZnSe, or any combination thereof.

According to an embodiment, the shell 15 may further include a metal or non-metal oxide in addition to the above-described semiconductor compound.

The metal or non-metal oxide may be, for example, a two-element compound such as, $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a three-element compound such as $MgAl_2O_4$, $CoFe_2O_4$, $NiFe_2O_4$, or $CoMn_2O_4$.

The shell 15 may have a single layer structure. The single layer structure may include one kind of compound or two or more kinds of compounds.

In an embodiment, the shell 15 may have a multi-layer structure.

According to an embodiment, the shell 15 may include i) a first shell covering the core 10 and ii) a second shell covering the first shell.

The material included in the first shell and the material included in the second shell may be partially different from each other.

According to an embodiment, the first shell may include GaP, ZnSe, ZnSeS, or any combination thereof, and the second shell may include ZnS.

An average particle diameter (D50) of the quantum dot 100 may be in a range of about 0.5 nm to about 20 nm. For example, the average particle diameter (D50) of the quantum dot 100 may be in a range of about 1 nm to about 10 nm. For example, the average particle diameter (D50) of the quantum dot 100 may be in a range of about 1.3 nm to about 7 nm. When the average particle diameter (D50) of the quantum dot 100 is within the above range, the quantum dot 100 may emit short wavelength-shifted blue light while having high emission quantum efficiency.

The quantum dot 100 has the first region 11 and the second region 12 as described in the specification, and may thus emit blue light having a maximum emission wavelength in a range of about 400 nm to about 490 nm. For example, the quantum dot 100 may emit blue light having a maximum emission wavelength in a range of about 430 nm to about 480 nm. For example, the quantum dot 100 may emit blue light having a maximum emission wavelength in a range of about 440 nm to about 475 nm. The quantum dot 100 may have a photoluminescence quantum yield (PLQY) of equal to or greater than about 70% or more. For example, the quantum dot 100 may have a PLQY in a range of about 70% to about 99%. For example, the quantum dot 100 may have a PLQY in a range of about 75% to about 95%. A full width of half maximum (FWHM) of the quantum dot 100 may be equal to or less than about 50 nm. For example, a FWHM of the quantum dot 100 may be in a range of about 35 nm to about 50 nm. For example, a FWHM of the quantum dot 100 may be in a range of about 40 nm to about 48 nm. High-quality optical members and devices may be implemented by using such quantum dots 100.

Heretofore, the quantum dot 100 having a spherical shape has been described, but the shape of the quantum dot is not limited thereto. For example, the quantum dot may have various shapes such as pyramidal, multi-arm, cubic nanoparticles, nanotubes, nanowires, nanofibers, and nanoplatelet particles.

Figure 2:
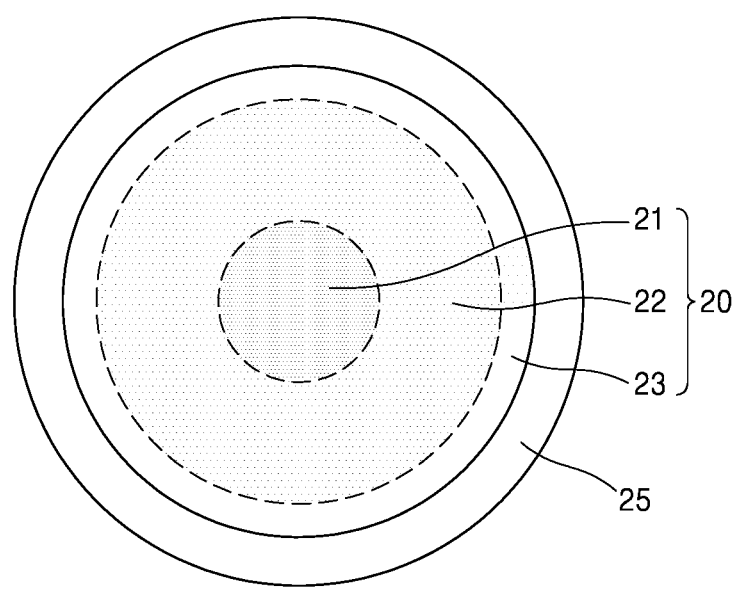
FIG. 2 is a schematic cross-sectional view of a quantum dot according to another embodiment.

[Description of Quantum Dot 100 Shown in FIG. 2]

FIG. 2 is a schematic cross-sectional view of a quantum dot according to another embodiment. The quantum dot 200 of FIG. 2 includes a core 20 including indium (In), $A^1$, and $A^2$, and a shell 25 covering the core 20. In the quantum dot 200 of FIG. 2, $A^1$ is a Group V element, and $A^2$ is a Group III element.

The core 20 may include a first region 21, a second region 22 covering the first region 21, and a third region 23 covering the second region 22.

Among the configurations of the quantum dot 200, descriptions of other configurations (for example, $A^1$, $A^2$, first region 21, second region 22, shell 25, average particle diameter of core 20, and average particle diameter of quantum dot 200) refer to the above description of FIG. 1.

The third region 23 may cover the second region 22, and the third region 23 may not include indium and may include $A^1$ and $A^2$.

For example, the third region 23 may include (or consist of) GaN, GaP, GaAs, GaSb, AlN, AlP, AlAs, AlSb, GaNP, GaNAs, GaNSb, GaPAs, GaPSb, AlNP, AlNAs, AlNSb, AlPAs, AlPSb, GaAlNP, GaAlNAs, GaAlNSb, GaAlPAs, GaAlPSb, or any combination thereof.

$A^2$ of the third region 23 may be an element introduced into the third region 23 by a cation exchange reaction. For example, the third region 23 of the core 10 is not formed by first synthesizing the first region 21 and the second region 22 and then coating or growing the third region 23 on the surface of the second region 22. Accordingly, the third region 23 is clearly distinguished from the shell 25 formed on the surface of the core 20 by a coating method or a growing method after first synthesizing the core 20. For example, the domain or phase of the second region 22 is continuously connected to the domain or phase of the third region 23, but the domain or phase of the core 20 may be discontinuously separated from the domain or phase of the shell 25.

According to an embodiment, $A^1$ included in the first region 21, $A^1$ included in the second region 22, and $A^1$ included in the third region 23 may be the same as one another.

According to another embodiment, the concentration of $A^2$ included in the third region 23 may have a concentration gradient in which the concentration of $A^2$ gradually increases along a direction from the interface between the second region 22 and the third region 23 toward the surface of the core 20.

[Method of Preparing Quantum Dot]

A method of preparing the above-described a quantum dot 100 or 200 may include:

providing a first particle including indium (In) and $A^1$;

forming the core 10 or 20 by contacting the first particle with a composition including a $A^2$-containing precursor at a temperature in a range of about 210° C. to about 340° C.; and forming the shell 15 or 25 covering the core 10 or 20.

For descriptions of $A^1$ and $A^2$, refer to the descriptions in this specification.

In the providing of the first particle, the first particle may include indium (In) and $A^1$ and may not include $A^2$.

The $A^1$-containing precursor used in the providing the first particle may include, for example, trioctylphosphine, trioctylphosphine oxide, oleylamine, octylamine, trioctyl amine, hexadecylamine, hexylphosphonic acid, tetradecylphosphonic acid, octylphosphonic acid, or any combination thereof.

According to an embodiment, an average particle diameter (D50) of the first particle may be equal to the average particle diameter (D50) of the core 10 or 20.

For example, an average particle diameter (D50) of the first particle may be in a range of about 0.1 nm to about 5 nm. For example, an average particle diameter (D50) of the first particle may be in a range of about 0.5 nm to about 3 nm. For example, an average particle diameter (D50) of the first particle may be in a range of about 0.8 nm to about 2 nm. When the average particle diameter (D50) of the first particle is within the above range, the quantum dot prepared according to the quantum dot preparation method may emit short wavelength-shifted blue light.

The forming the core 10 or 20 including indium (In), $A^1$, and $A^2$ may include a forming a second region 12 or 22 of the core 10 or 20 and/or a third region 23 of the core 20 by a cation exchange reaction in which at least indium cations of the first particle are substituted with $A^2$ cations by contacting the first particle with a composition including a $A^2$-containing precursor at a temperature in a range of about 210° C. to about 340° C. For example, the cation exchange reaction temperature range may be in a range of about 210° C. to about 340° C. For example, the cation exchange reaction temperature range may be in a range of about 230° C. to about 320° C. For example, the cation exchange reaction temperature range may be in a range of about 250° C. to about 310° C.

When the cation exchange reaction temperature is within the above range, the quantum dot 100 or 200 may be provided with the first region 11 or 21 as described in this specification, and indium and $A^2$ included in the second region 12 or 22 of the quantum dot 100 or 200 may be alloyed with each other, so that the quantum dot 100 or 200 may emit blue light having a maximum emission wavelength in a range of about 400 nm to about 490 nm, while having high emission quantum efficiency.

The $A^2$-containing precursor may be selected from any compound that includes $A^2$ and enables a cation exchange reaction between the indium cation and $A^2$ cation in the first particle.

For example, the $A^2$-containing precursor may include an $A^2$-containing halogenide, an $A^2$-containing oxide, an $A^2$-containing nitride, an $A^2$-containing antimonide, an $A^2$-containing oxynitride, an $A^2$-containing sulfide, an $A^2$-containing oxyhalogenide, an $A^2$-containing oxyhalogenide hydrate, an $A^2$-containing nitrate, an $A^2$-containing nitrate hydrate, an $A^2$-containing sulfate, an $A^2$-containing sulfate hydrate, an $A^2$-containing amine derivative, an $A^2$-containing hydrocarbon derivative, or any combination thereof.

According to an embodiment, the $A^2$-containing precursor may include $A^2I_3$, $A^2Br_3$, $A^2Cl_3$, $(A^2)_2Cl_4$, $(A^2)_2O_4$, $A^2N$, $A^2Sb$, $(A^2)_2S_3$, $A^2(ClO_4)_3 \cdot yH_2O$, $A^2(NO_3)_3 \cdot yH_2O$, $(A^2)_2(SO_4)_3$, $(A^2)_2(SO_4)_3 \cdot yH_2O$, $C_{12}H_{36}(A^2)_2N_6$, $A^2(CH_3)_3$, or a combination thereof, wherein y is a real number greater than zero.

According to another embodiment, the $A^2$-containing precursor may be $GaI_3$.

The composition including the $A^2$-containing precursor may further include a solvent, a dispersant, or the like, in addition to the $A^2$-containing precursor.

For example, the solvent may include trioctylphosphine (TOP), tributylphosphine (TBP), triphenylphosphine (TPP), diphenylphosphine (DPP), oleylamine (OLA), dodecylamine (DDA), hexadecylamine (HDA), octadecylamine (ODA), octylamine (OTA), trioctylamine (TOA), oleic acid (OA), 1-otadecene (ODE), or any combination thereof.

The shell 15 or 25 covering the core 10 or 20 may be formed by a process.

The forming of the shell 15 or 25 may be performed at a temperature in a range of about 180° C. to about 340° C. For example, the forming of the shell 15 or 25 may be performed at a temperature in a range of about 200° C. to about 320° C.

The precursor used in the forming of the shell 15 or 25 may include any precursor capable of forming the shell 15 or 25 as described in this specification.

For example, the precursor used in the forming of the shell 15 or 25 may include a zinc precursor. The zinc precursor may include, for example, dimethyl zinc, diethyl zinc, zinc acetate, zinc acetylacetonate, zinc iodide, zinc bromide, zinc chloride zinc chloride), zinc fluoride, zinc carbonate, zinc cyanide, zinc nitrate, zinc oxide, zinc peroxide, zinc perchlorate, zinc sulfate, or any combination thereof.

As another example, the precursor used in the forming of the shell 15 or 25 may include a sulfur (S) precursor such as trioctylphosphine sulfide.

As another example, the precursor used in the forming of the shell 15 or 25 may include a selenium (Se) precursor such as trioctylphosphine selenide.

[Optical Member]

The quantum dot may be used in various optical members. Thus, according to another aspect, an optical member including the quantum dot is provided.

According to an embodiment, the optical member may be a light control means.

According to another embodiment, the optical member may be a color filter, a color conversion member, a capping layer, a light extraction efficiency improvement layer, a selective light absorption layer, or a polarization layer.

[Electronic Device]

The quantum dot may be used in various electronic devices. Thus, according to another aspect, an electronic device including the quantum dot is provided.

According to an embodiment, there is provided an electronic device including a light source and a color conversion member disposed in a path of light emitted from the light source, wherein the color conversion member includes the quantum dot.

Figure 3:
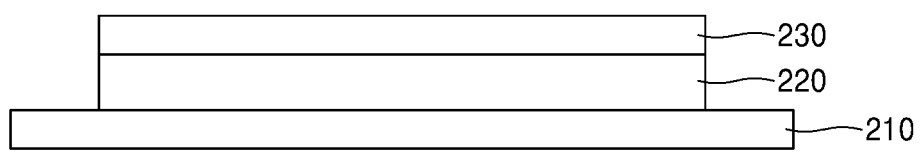
FIG. 3 is a schematic cross-sectional view illustrating the structure of an electronic device according to an embodiment.

FIG. 3 is a schematic cross-sectional view illustrating the structure of an electronic device 200A according to an embodiment. The electronic device 200A of FIG. 3 includes a substrate 210; a light source 220 disposed on the substrate; and a color conversion member 230 disposed on the light source 220.

For example, the light source 220 may be a backlight unit (BLU) used in a liquid crystal display (LCD), a fluorescent lamp, a light emitting diode, an organic light emitting diode, or a quantum dot light emitting diode (QLED), or any combination thereof. The color conversion member 230 may be disposed on at least one travel direction of light emitted from the light source 220.

At least one area of the color conversion member 230 of the electronic device 200A includes the quantum dot, and the area absorbs light emitted from the light source 220 to emit blue light having a maximum emission wavelength in the range of about 400 nm to about 490 nm.

That the color conversion member 230 is disposed on at least one travel direction of light emitted from the light source 220 does not exclude a case that other elements are further included between the color conversion member 230 and the light source 220.

For example, a polarizing plate, a liquid crystal layer, a light guide plate, a diffusing plate, a prism sheet, a microlens sheet, a luminance enhancing sheet, a reflective film, a color filter, or any combination thereof may be additionally disposed between the light source 220 and the color conversion member 230.

As another example, a polarizing plate, a liquid crystal layer, a light guide plate, a diffusing plate, a prism sheet, a microlens sheet, a luminance enhancing sheet, a reflective film, a color filter, or any combination thereof may be additionally disposed on the color conversion member 230.

The electronic device 200A shown in FIG. 3 is an example of the device according to the embodiment, and may have various forms, and may additionally include various configurations for this purpose.

According to another embodiment, the electronic device may have a structure in which a light source, a light guide plate, a color conversion member, a first polarizing plate, a liquid crystal layer, a color filter, and a second polarizing plate are sequentially arranged.

According to still another embodiment, the electronic device may have a structure in which a light source, a light guide plate, a first polarizing plate, a liquid crystal layer, a second polarizing plate, and a color conversion member sequentially arranged.

In the above embodiments, the color filter may include a pigment or dye. In the above embodiments, any one of the first polarizing plate and the second polarizing plate may be a vertical polarizing plate, and the other thereof may be a horizontal polarizing plate.

The quantum dot as described in this specification may be used as an emitter. Accordingly, according to another embodiment, there is provided an electronic device including a light emitting element including a first electrode, a second electrode facing the first electrode, and an emission layer disposed between the first electrode and the second electrode, wherein the light emitting element may include the quantum dot. For example, the emission layer of the light emitting element may include the quantum dot.

The light emitting element may further include a hole transport region disposed between the first electrode and the emission layer, an electron transport region disposed between the emission layer and the second electrode, or a combination thereof.

Figure 4:
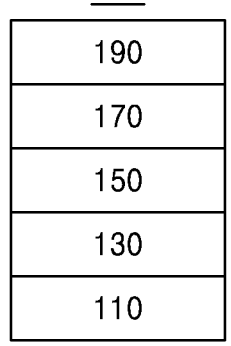
FIG. 4 is a schematic cross-sectional view illustrating the structure of an electronic device according to another embodiment.

FIG. 4 is a schematic cross-sectional view illustrating the structure of a light emitting element 10A according to an embodiment.

The light emitting element 10A includes a first electrode 110; a second electrode 190 facing the first electrode 110; an emission layer 150 disposed between the first electrode 110 and the second electrode 190 and including quantum dots; a hole transport region 130 disposed between the first electrode 110 and the emission layer 150; and an electron transport region 170 disposed between the emission layer 150 and the second electrode 190. Hereinafter, each layer of the light emitting element 10A will be described.

[First Electrode 110]

In FIG. 4, a substrate may be additionally disposed under the first electrode 110 or on the second electrode 190. For the substrate, a glass substrate or a plastic substrate having excellent mechanical strength, thermal stability, transparency, surface smoothness, handling easiness, and water resistance may be used.

For example, in the case of a top emission type in which light from the light emitting element 10A is emitted in a direction opposite to the substrate, the substrate need not be transparent, and may be opaque or translucent. For example, the substrate may be formed of a metal. When the substrate is formed of a metal, the substrate may include carbon, iron, chromium, manganese, nickel, titanium, molybdenum, stainless steel (SUS), an Invar® alloy, an Inconel® alloy, a Kovar® alloy, or any combination thereof.

Further, although not shown in FIG. 4, a buffer layer, a thin film transistor, and an organic insulating layer may be provided between the substrate and the first electrode 110.

The first electrode 110 may be formed, for example, by providing a material for a first electrode on the substrate using a deposition method or a sputtering method. The first electrode 110 may be a reflective electrode, a transflective electrode, or a transmissive electrode. In order to form the first electrode 110 as a transmissive electrode, the material for the first electrode may include indium tin oxide (ITO), indium zinc oxide (IZO), tin oxide ($SnO_2$), zinc oxide (ZnO), gallium zinc oxide (GZO), aluminum zinc oxide (AZO), InZnSnOx (IZSO), ZnSnOx (ZSO), graphene, PEDOT:PSS, carbon nanotubes, silver nanowires (Ag nanowires), gold nanowires (Au nanowires), metal mesh, or any combination thereof. In an embodiment, in order to form the first electrode 110 as a reflective electrode or a transflective electrode, the material for the first electrode may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layer structure or a multi-layer structure having multiple layers. For example, the first electrode 110 may have a three-layer structure of ITO/Ag/ITO.

[Hole Transport Region 130]

The hole transport region 130 may have i) a single-layer structure consisting of a single layer including a single material, ii) a single-layer structure consisting of a single layer including different materials from each other, or iii) a multi-layer structure consisting of multiple layers including different materials.

The hole transport region 130 may include a hole injection layer, a hole transport layer, an emission auxiliary layer, an electron blocking layer, or any combination thereof.

For example, the hole transport region 130 may have a single-layer structure consisting of a single layer including different materials from each other, or may have a multi-layer structure of a hole injection layer/hole transport layer, a hole injection layer/hole transport layer/emission auxiliary layer, a hole injection layer/emission auxiliary layer, a hole transport layer/emission auxiliary layer or a hole injection layer/hole transport layer/electron blocking layer, which may be sequentially stacked from the first electrode 110. However, the disclosure is not limited thereto.

The hole transport region 130 may include an amorphous inorganic or organic material. The inorganic material may include NiO, $MoO_3$, $Cr_2O_3$, and/or $Bi_2O_3$. Further, the inorganic material may include a p-type inorganic semiconductor in which an iodide, bromide, or chloride of Cu, Ag, or Au is doped with a non-metal such as O, S, Se, or Te, a p-type inorganic semiconductor in which a compound containing Zn is doped with a metal such as Cu, Ag, or Au or with a non-metal such as N, P, As, Sb, or Bi, or a voluntary p-type inorganic semiconductor such as ZnTe.

The organic material may include m-MTDATA, TDATA, 2-TNATA, NPB(NPD), β-NPB, TPD, Spiro-TPD, Spiro-NPB, methylated-NPB, TAPC, HMTPD, TCTA(4,4',4"-tris (N-carbazolyl)triphenylamine), Pani/DBSA (Polyaniline/ Dodecylbenzenesulfonic acid), PEDOT/PSS(Poly(3,4-ethylenedioxythiophene)/Poly(4-styrenesulfonate)), Pani/ CSA (Polyaniline/Camphor sulfonic acid), PANI/PSS (Polyaniline/Poly(4-styrenesulfonate)), PVK (Polyvinylcarbazole), a compound represented by Formula 201, a compound represented by Formula 202, or any combination thereof:

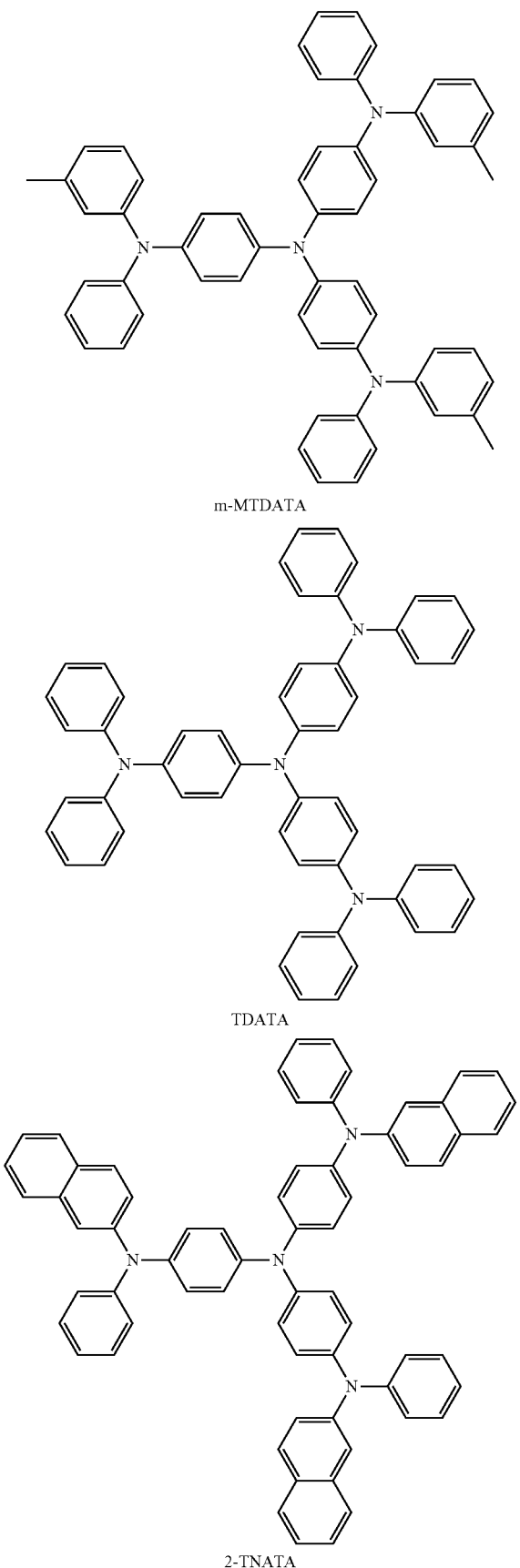

m-MTDATA

TDATA

2-TNATA

-continued

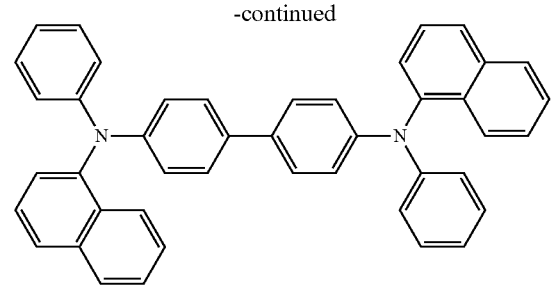
NPB

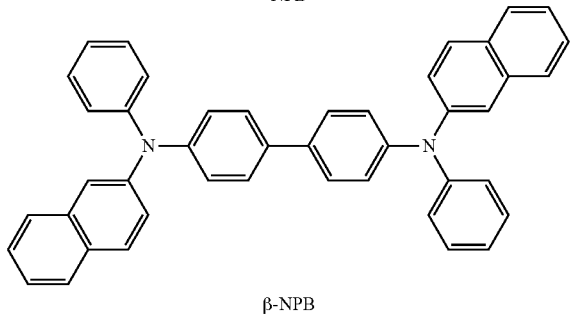
β-NPB

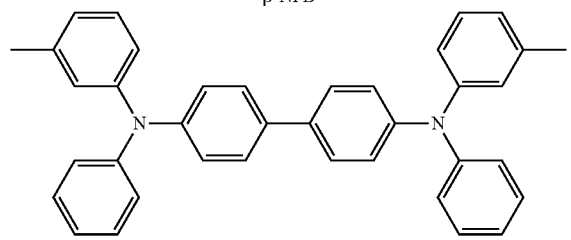
TPD

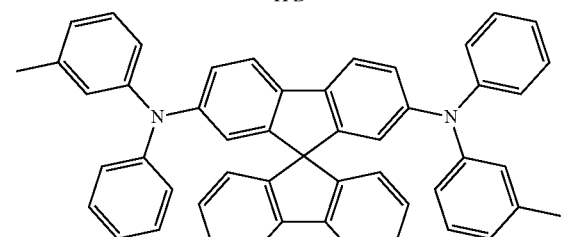
Spiro-TPD

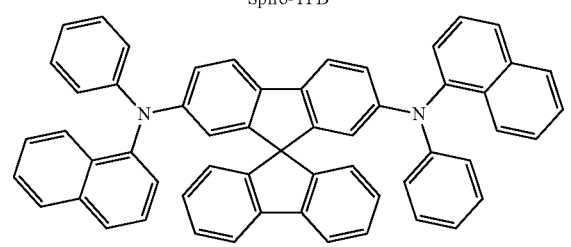
Spiro-NPB

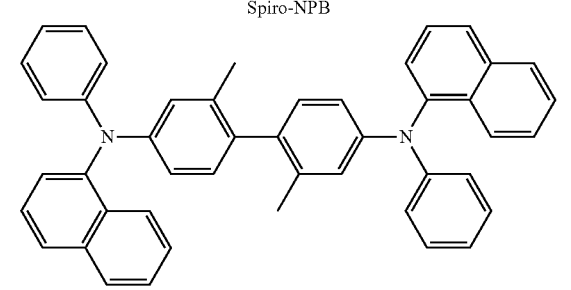
methylated-NPB

-continued

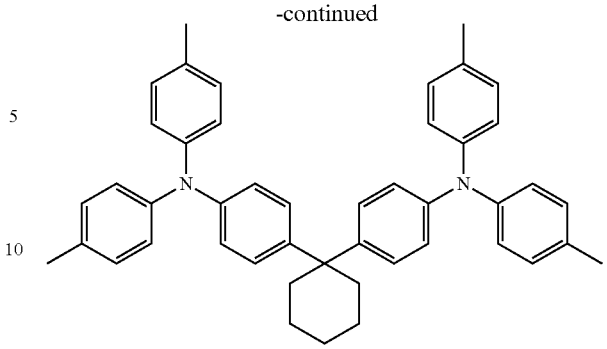
TAPC

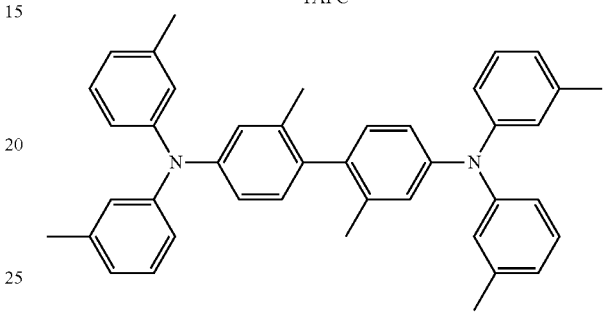
HMTPD

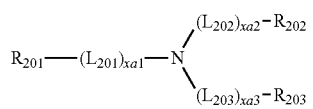
[Formula 201]

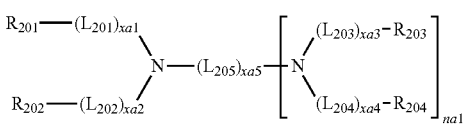
[Formula 201]

In Formulas 201 and 202, $L_{201}$ to $L_{204}$ may each independently be a $C_3$-$C_{60}$ carbocyclic group substituted or unsubstituted with at least one $R_{10a}$ or a $C_1$-$C_{60}$ heterocyclic group substituted or unsubstituted with at least one $R_{10a}$, $L_{205}$ may be *—O—*', *—S—*', *—N(Q201)-*', a $C_1$-$C_{20}$ alkylene group substituted or unsubstituted with at least one $R_{10a}$, a $C_2$-$C_{20}$ alkenylene group substituted or unsubstituted with at least one $R_{10a}$, a $C_3$-$C_{60}$ carbocyclic group substituted or unsubstituted with at least one $R_{10a}$, or a $C_1$-$C_{60}$ heterocyclic group substituted or unsubstituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group substituted or unsubstituted with at least one $R_{10a}$ or a $C_1$-$C_{60}$ heterocyclic group substituted or unsubstituted with at least one $R_{10a}$, $R_{203}$ and $R_{204}$ may be connected to each other through a single bond, a $C_1$-$C_5$ alkylene group substituted or unsubstituted with at least one $R_{10a}$, or a $C_2$-$C_5$ alkenylene group substituted or unsubstituted with at least one $R_{10a}$ to form a $C_8$-$C_{60}$ polycyclic group substituted or unsubstituted with at least one $R_{10a}$, and na1 may be an integer from 1 to 4.

A thickness of the hole transport region 130 may be in a range of about 50 Å to about 10000 Å. For example, the thickness of the hole transport region 130 may be in a range of about 100 Å to about 4000 Å. When the hole transport area 130 includes a hole injection layer, a hole transport layer, or any combination thereof, a thickness of the hole injection layer may be in a range of about 100 Å to about 9000 Å, and a thickness of the hole transport layer may be in a range of about 50 Å to about 2000 Å. For example, the thickness of the hole injection layer may be in a range of about 100 Å to about 1000 Å. For example, the thickness of the hole transport layer may be in a range of about 100 Å to about 1500 Å. When the thicknesses of the hole transport region 130, the hole injection layer, and the hole transport layer are within the above ranges, respectively, satisfactory hole transport characteristics may be obtained without a substantial increase in driving voltage.

The emission auxiliary layer is a layer that serves to increase light emission efficiency by compensating for an optical resonance distance according to the wavelength of light emitted from the emission layer, and the electron blocking layer is a layer that serves to prevent the leakage of electrons from the emission layer to the hole transport region 130. Materials that may be included in the above-described hole transport region 130 may be included in the emission auxiliary layer and the electron blocking layer.

[p-Dopant]

The hole transport region 130 may include a charge-generating material in addition to the above-described materials in order to improve conductivity. The charge-generating material may be uniformly or non-uniformly dispersed in the hole transport region 130 (for example, dispersed in the form of a single layer including a charge-generating material).

The charge-generating material may be, for example, a p-dopant.

For example, the p-dopant may have a lowest unoccupied molecular orbital (LUMO) energy level of equal to or less than about −3.5 eV.

According to an embodiment, the p-dopant may include a quinone derivative, a cyano group-containing compound, an element EL1 and element EL2-containing compound, or any combination thereof.

Examples of the quinone derivative may include TCNQ and F4-TCNQ.

Examples of the cyano group-containing compound may include HAT-CN and a compound represented by Formula 221.

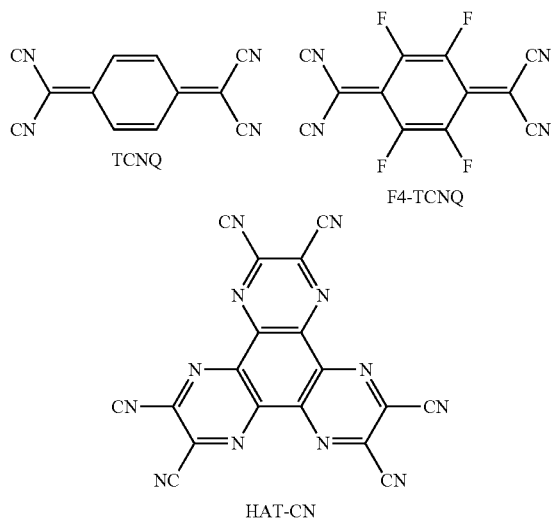

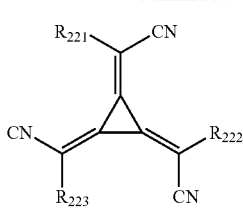

[Formula 221]

In Formula 221, $R_{221}$ to $R_{223}$ may each independently be a $C_3$-$C_{60}$ carbocyclic group substituted or unsubstituted with at least one $R_{10a}$ or a $C_1$-$C_{60}$ heterocyclic group substituted or unsubstituted with at least one $R_{10a}$, at least one of $R_{221}$ to $R_{223}$ may each independently be a cyano group; —F; —Cl; —Br; —I; a $C_1$-$C_{20}$ alkyl group substituted with a cyano group, —F, —Cl, —Br, —I, or any combination thereof; or a $C_3$-$C_{60}$ carbocyclic group or $C_1$-$C_{60}$ heterocyclic group substituted with any combination thereof.

In the element EL1 and element EL2-containing compound, the element EL1 may be a metal, a metalloid, or any combination thereof, and the element EL2 may be a non-metal, a metalloid, or any combination thereof.

Examples of the metal may include alkaline metals (for example, lithium (Li), sodium (Na), potassium (K), rubidium (Rb), and cesium (Cs)); alkaline earth metals (for example, beryllium (Be), magnesium (Mg), calcium (Ca), strontium (Sr), and barium (Ba)); transition metals for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), and gold (Au)); post-transition metals (for example, zinc (Zn), indium (In), and tin (Sn)); and lanthanide metals (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu)).

Examples of the metalloid may include silicon (Si), antimony (Sb), and tellurium (Te).

Examples of the non-metal may include oxygen (O) and halogen (for example, F, Cl, Br, and I).

Examples of the element EL1 and element EL2-containing compound may include metal oxides, metal halides (for example, metal fluoride, metal chloride, metal bromide, and metal iodide), metalloid halides (for example, metalloid fluoride, metalloid chloride, metalloid bromide, and metalloid iodide), metal tellurides, and any combination thereof.

Examples of the metal oxides may include tungsten oxides (for example, WO, $W_2O_3$, $WO_2$, $WO_3$, and $W_2O_5$), molybdenum oxides (MoO, $Mo_2O_3$, $MoO_2$, $MoO_3$, and $Mo_2O_5$), and rhenium oxides (for example, $ReO_3$).

Examples of the metal halides may include alkali metal halides, alkaline earth metal halides, transition metal halides, post-transition metal halides, and lanthanide metal halides.

Examples of the alkali metal halides may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halides may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, and $SrI_2$.

Examples of the transition metal halides may include titanium halides (for example, $TiF_4$, $TiCl_4$, $TiBr_4$, and $TiI_4$), zirconium halides (for example, $ZrF_4$, $ZrCl_4$, $ZrBr_4$, and $ZrI_4$), hafnium halides (for example, $HfF_4$, $HfCl_4$, $HfBr_4$, and $HfI_4$), niobium halides (for example., $NbF_3$, $NbCl_3$, $NbBr_3$, and $NbI_3$), tantalum halides (for example, $TaF_3$, $TaCl_3$, $TaBr_3$, and $TaI_3$), chromium halides (for example, $CrF_3$, $CrCl_3$, $CrBr_3$, and $CrI_3$), molybdenum halides (for example, $MoF_3$, $MoCl_3$, $MoBr_3$, and $MoI_3$), tungsten halides (for example, $WF_3$, $WCl_3$, $WBr_3$, and $WI_3$), manganese halides (for example, $MnF_2$, $MnCl_2$, $MnBr_2$, and $MnI_2$), technetium halides (for example, $TcF_2$, $TcCl_2$, $TcBr_2$, and $TcI_2$.), rhenium halides (for example, $ReF_2$, $ReCl_2$, $ReBr_2$, and $ReI_2$), iron halides (for example, $FeF_2$, $FeCl_2$, $FeBr_2$, and $FeI_2$), ruthenium halides (for example, $RuF_2$, $RuCl_2$, $RuBr_2$, and $RuI_2$), osmium halides (for example, $OsF_2$, $OsCl_2$, $OsBr_2$, and $OsI_2$), cobalt halides (for example, $CoF_2$, $CoCl_2$, $CoBr_2$, and $CoI_2$), rhodium halides (for example, $RhF_2$, $RhCl_2$, $RhBr_2$, and $RhI_2$), iridium halides (for example, $IrF_2$, $IrCl_2$, $IrBr_2$, and $IrI_2$), nickel halides (for example, $NiF_2$, $NiCl_2$, $NiBr_2$, and $NiI_2$), palladium halides (for example, $PdF_2$, $PdCl_2$, $PdBr_2$, and $PdI_2$), platinum halides (for example, $PtF_2$, $PtCl_2$, $PtBr_2$, and $PtI_2$), copper halides (for example, $CuF$, $CuCl$, $CuBr$, and $CuI$), silver halides for example, $AgF$, $AgCl$, $AgBr$, and $AgI$), and gold halides (for example, $AuF$, $AuCl$, $AuBr$, and $AuI$).

Examples of the post-transition metal halides include zinc halides (for example, $ZnF_2$, $ZnCl_2$, $ZnBr_2$, and $ZnI_2$), indium halides (for example, $InI_3$), tin halides (for example, $SnI_2$).

Examples of the lanthanide metal halides may include $YbF$, $YbF_2$, $YbF_3$, $SmF_3$, $YbCl$, $YbCl_2$, $YbCl_3$, $SmCl_3$, $YbBr$, $YbBr_2$, $YbBr_3$, $SmBr_3$, $YbI$, $YbI_2$, $YbI_3$, and $SmI_3$.

Examples of the metalloid halides may include antimony halides (for example, $SbCl_5$).

Examples of the metal tellurides may include alkali metal tellurides (for example, $Li_2Te$, $Na_2Te$, $K_2Te$, $Rb_2Te$, and $Cs_2Te$), alkaline earth metal tellurides (for example, $BeTe$, $MgTe$, $CaTe$, $SrTe$, and $BaTe$), transition metal tellurides (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, $MnTe$, $TcTe$, $ReTe$, $FeTe$, $RuTe$, $OsTe$, $CoTe$, $RhTe$, $IrTe$, $NiTe$, $PdTe$, $PtTe$, $Cu_2Te$, $CuTe$, $Ag_2Te$, $AgTe$, and $Au_2Te$.), post-transition metal tellurides (for example, $ZnTe$), and lanthanide metal tellurides (for example, $LaTe$, $CeTe$, $PrTe$, $NdTe$, $PmTe$, $EuTe$, $GdTe$, $TbTe$, $DyTe$, $HoTe$, $ErTe$, $TmTe$, $YbTe$, and $LuTe$).

[Emission Layer 150]

The emission layer 150 may be a single quantum dot layer or a structure in which two or more quantum dot layers are stacked. For example, the emission layer 150 may be a single quantum dot layer or a structure in which two to a hundred quantum dot layers are stacked.

The emission layer 150 may include the quantum dots described in this specification.

The emission layer 150 may further include a dispersion medium in which the quantum dots are dispersed in a coordinated form in addition to the quantum dots as described in this specification. The dispersion medium may include an organic solvent, a polymer resin, or any combination thereof. As the dispersion medium, any dispersion medium may be used as long as it is a transparent medium that does not affect the optical performance of the quantum dots, is not deteriorated by light, does not reflect light, and does not cause light absorption. The organic solvent may include toluene, chloroform, ethanol, octane, or any combination thereof, and the polymer resin may include an epoxy resin, a silicon resin, a polystyrene resin, an acrylic resin, or any combination thereof.

The emission layer 150 may be formed by applying a composition for forming the emission layer including quantum dots on the hole transport region 130 and volatilizing at least a part of the solvent contained in the composition for forming the emission layer.

For example, water, hexane, chloroform, toluene, or octane may be used as the solvent.

The application of the composition for forming the emission layer may be performed using spin coating, casting, microgravure coating, gravure coating, bar coating, roll coating, wire bar coating, dip coating, spray coating, screen printing, flexographic printing, offset printing, inkjet printing, or the like.

When the light emitting element 10A is a full-color light emitting element, the light emitting element 10A may include emission layers that emit light of different colors for each sub-pixel.

For example, the emission layer 150 may be patterned into a first color emission layer, a second color emission layer, and a third color emission layer for each sub-pixel. At least one of the above-described emission layers may include quantum dots of an embodiment. For example, the first color emission layer may be a quantum dot emission layer including quantum dots, and each of the second color emission layer and the third color emission layer may be an organic emission layer including an organic compound. Here, the first to third colors are different colors, and light of the first to third colors may have different maximum emission wavelengths. The first to third colors may be combined with each other to make a white color.

As another example, the emission layer 150 may further include a fourth color emission layer. At least one of the first to fourth color emission layers is a quantum dot emission layer including quantum dots, and others thereof may be organic emission layers each including an organic compound. Here, the first to fourth colors are different colors, and light of the first to fourth colors may have different maximum emission wavelengths. The first to fourth colors may be combined with each other to make a white color.

In an embodiment, the light emitting element 10A may have a structure in which two or more emission layers emitting light of the same or different colors are stacked to contact each other or to be spaced apart from each other. At least one of the two or more color emission layers is a quantum dot emission layer including quantum dots, and others thereof may be organic emission layers each including an organic compound. For example, the light emitting element 10A may include a first color emission layer and a second color emission layer. The first color and the second color may be the same as or different from each other. For example, both the first color and the second color may be blue colors.

The emission layer 150 may further include at least one selected from an organic compound and a semiconductor compound, in addition to the quantum dots.

The organic compound may include a host and a dopant. The host and the dopant may include a host and a dopant commonly used in organic light emitting elements.

The semiconductor compound may be an organic and/or inorganic perovskite.

A thickness of the emission layer 150 may be in a range of about 7 nm to about 100 nm. For example, the thickness of the emission layer 150 may be in a range of about 15 nm to about 50 nm. When the thickness of the emission layer 150 is within the above range, the light emitting element 10A may have excellent light emission efficiency and/or lifetime due to the control of pores that may be generated by the arrangement of quantum dot particles in the emission layer 150.

[Electron Transport Region 170]

The electron transport region 170 may have i) a single-layer structure consisting of a single layer including a single material, ii) a single-layer structure consisting of a single layer including different materials from each other, or iii) a multi-layer structure consisting of multiple layers including different materials.

The electron transport region 170 may include at least one of a buffer layer, a hole blocking layer, an electron control layer, an electron transport layer, and an electron injection layer.

For example, the electron transport region 170 may have a multi-layer structure of an electron transport layer/electron injection layer, a hole blocking layer/electron transport layer/electron injection layer, an electron control layer/electron transport layer/electron injection layer, or a buffer layer/electron transport layer/electron injection layer, which are sequentially stacked from the emission layer 150. However, the disclosure is not limited thereto.

The hole transport region 130 may include a conductive metal oxide. For example, the hole transport region 130 may include ZnO, $TiO_2$, $WO_3$, $SnO_2$, $In_2O_3$, $Nb_2O_5$, $Fe_2O_3$, $CeO_2$, $SrTiO_3$, $Zn_2SnO_4$, $BaSnO_3$, $In_2S_3$, ZnSiO, PC60BM, PC70BM, In-doped ZnO(IZO), Al-doped $TiO_2I$, Ga-doped $TiO_2$, In-doped $TiO_2$, Al-doped $WO_3$, Ga-doped $WO_3$, In-doped $WO_3$, Al-doped $SnO_2$, Ga-doped $SnO_2$, In-doped $SnO_2$, Mg-doped $In_2O_3$, Al-doped $In_2O_3$, Ga-doped $In_2O_3$, Mg-doped $Nb_2O_5$, Al-doped $Nb_2O_5$, Ga-doped $Nb_2O_5$, Mg-doped $Fe_2O_3$, Al-doped $Fe_2O_3$, Ga-doped $Fe_2O_3$, In-doped $Fe_2O_3$, Mg-doped $CeO_2$, Al-doped $CeO_2$, Ga-doped $CeO_2$, In-doped $CeO_2$, Mg-doped $SrTiO_3$, Al-doped $SrTiO_3$, Ga-doped $SrTiO_3$, In-doped $SrTiO_3$, Mg-doped $Zn_2SnO_4$, Al-doped $Zn_2SnO_4$, Ga-doped $Zn_2SnO_4$, In-doped $Zn_2SnO_4$, Mg-doped $BaSnO_3$, Al-doped $BaSnO_3$, Ga-doped $BaSnO_3$, In-doped $BaSnO_3$, Mg-doped $In_2S_3$, Al-doped $In_2S_3$, Ga-doped $In_2S_3$, In-doped $In_2S_3$, Mg-doped ZnSiO, Al-doped ZnSiO, Ga-doped ZnSiO, In-doped ZnSiO, or any combination thereof.

The organic material may include a compound having electron transport properties such as BCP(2,9-Dimethyl-4,7-diphenyl-1,10-phenanthroline), Bphen(4,7-Diphenyl-1,10-phenanthroline), $Alq_3$, BAlq, TAZ(3-(Biphenyl-4-yl)-5-(4-tert-butylphenyl)-4-phenyl-4H-1,2,4-triazole), or NTAZ.

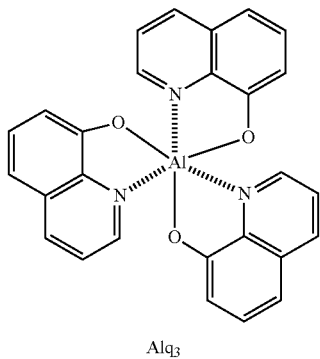

Alq$_3$

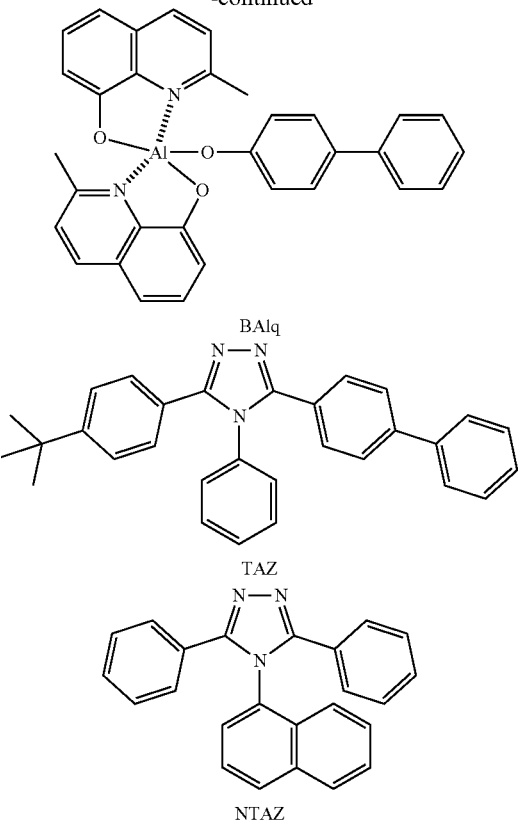

BAlq

TAZ

NTAZ

Further, the organic material may be a metal-free compound including a π electron-deficient nitrogen-containing $C_1$-$C_{60}$ cyclic group.

For example, the electron transport region 170 may include a compound represented by Formula 601 below.

$$[Ar_{601}]_{xe11}-[(L_{601})_{xe1}-R_{601}]_{xe21} \quad \text{[Formula 601]}$$

In Formula 601, $Ar_{601}$ and $L_{601}$ may each independently be a $C_3$-$C_{60}$ carbocyclic group substituted or unsubstituted with at least one $R_{10a}$ or a $C_1$-$C_{60}$ heterocyclic group substituted or unsubstituted with at least one $R_{10a}$, xe11 may be 1, 2, or 3, xe may be 0, 1, 2, 3, 4, or 5, $R_{601}$ may be a $C_3$-$C_{60}$ carbocyclic group substituted or unsubstituted with at least one $R_{10a}$, a $C_1$-$C_{60}$ heterocyclic group substituted or unsubstituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), for explanations on $Q_{601}$ to $Q_{603}$, refer to the explanation on $Q_1$ in this specification, xe21 may be 1, 2, 3, 4, or 5, and $Ar_{601}$, $L_{601}$ and $R_{601}$ may each independently be a π electron-deficient nitrogen-containing $C_1$-$C_{60}$ cyclic group substituted or unsubstituted with at least one $R_{10a}$.

A thickness of the electron transport region 170 may be in a range of about 160 Å to about 5000 Å. For example, the thickness of the electron transport region 170 may be in a range of about 100 Å to about 4000 Å. When the electron transport region 170 includes a buffer layer, a hole blocking layer, an electron control layer, an electron transport layer, or any combination thereof, a thickness of the buffer layer, the hole blocking layer, or the electron control layer may each be in a range of about 20 Å to about 1000 Å, and a thickness of the electron transport layer may be in a range of about 100 Å to about 1000 Å. For example, the thickness of the buffer layer, the hole blocking layer, or the electron control layer may each be in a range of about 30 Å to about 300 Å. For example, the thickness of the electron transport layer may be in a range of about 150 Å to about 500 Å. When the thickness of the buffer layer, the hole blocking layer, the electron control layer, the electron transport layer and/or the electron transport layer satisfies the above ranges, a satisfactory degree of electron transport characteristics may be obtained without a substantial increase in driving voltage.

The electron transport region 170 (for example, an electron transport layer in the electron transport region) may further include a metal-containing material in addition to the above-described materials.

The metal-containing material may include an alkali metal complex, an alkaline earth metal complex, or any combination thereof. The metal ion of the alkali metal complex may be a Li ion, Na ion, K ion, Rb ion, or Cs ion, and the metal ion of the alkaline earth metal complex may be a Be ion, Mg ion, Ca ion, Sr ion, or Ba ion. Ligands coordinated to the metal ions of the alkali metal complex and alkaline earth metal complex may each independently include hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazol, hydroxyphenylpyridine, hydroxyphenylbenzoimidazole, hydroxyphenylbenzothiazole, bipyridine, phenanthroline, cyclopentadiene, or any combination thereof.

For example, the metal-containing material may include a Li complex. The Li complex may include, for example, the following compound ET-D1 (LiQ) or ET-D2:

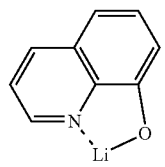

ET-D1

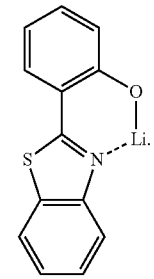

ET-D2

The electron transport region 170 may include an electron injection layer that facilitates the injection of electrons from the second electrode 190. The electron injection layer may directly contact the second electrode 190.

The electron injection layer may have i) a single-layer structure consisting of a single layer including a single material, ii) a single-layer structure consisting of a single layer including different materials from each other, or iii) a multi-layer structure consisting of multiple layers including different materials.

The electron injection layer may include an alkali metal, an alkaline earth metal, rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

Each of the alkali metal-containing compound, the alkaline earth metal-containing compound, and the rare earth metal-containing compound may include oxide, halide (for example, fluoride, chloride, bromide, or iodide), or telluride of each of the alkali metal, the alkali earth metal, and the rare earth metal, or any combination thereof.

The alkali metal-containing compound may include an alkali metal oxide such as $Li_2O$, $Cs_2O$, or $K_2O$, an alkali metal halide such as LiF, NaF, CsF, KF, LiI, NaI, CsI, or KI, or any combination thereof. The alkaline earth metal-containing compound may include and alkaline earth metal compound such as BaO, SrO, CaO, $Ba_xSr_{1-x}O$ (x is a real number satisfying 0<x<1), or $Ba_xCa_{1-x}O$ (x is a real number satisfying 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth metal complex, and the rare earth metal complex may each include i) one of the ions of alkali metal, alkaline earth metal and rare earth metal as described above, and ii) a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzoimidazole, hydroxyphenylbenzothiazole, bipyridine, phenanthroline, cyclopentadiene, or any combination thereof.

The electron injection layer may consist only of an alkali metal, alkaline earth metal, rare earth metal, alkali metal-containing compound, alkaline earth metal-containing compound, rare earth metal-containing compound, alkali metal complex, alkaline earth metal complex, rare earth metal complex, or any combination thereof, as described above, and may further include an organic material (for example, the compound represented by Formula 601 above).

According to an embodiment, the electron injection layer may consist of i) an alkali metal-containing compound (for example, alkali metal halide), or may consist of ii) a) an alkali metal-containing compound (for example, alkali metal halide) and b) alkali metal, alkaline earth metal, rare earth metal, or any combination thereof. For example, the electron injection layer may be a KI:Yb co-deposition layer, an RbI:Yb co-deposition layer, or the like.

When the electron injection layer further includes an organic material, the alkali metal, alkaline earth metal, rare earth metal, alkali metal-containing compound, alkaline earth metal-containing compound, rare earth metal-containing compound, alkali metal complex, alkaline earth metal complex, rare earth metal complex, or any combination thereof may be uniformly or non-uniformly dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer satisfies the above-described range, satisfactory electron injection characteristics may be obtained without a substantial increase in driving voltage.

[Second Electrode 190]

A second electrode 190 is disposed on the above-described electron transport region 170. The second electrode 190 may be a cathode, which is an electron injection electrode. As a material for the second electrode 190, a metal, an alloy, an electrically conductive compound, or any combination thereof, having a low work function, may be used.

The second electrode 190 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 190 may be a transmissive electrode, a transflective electrode, or a reflective electrode.

The second electrode 190 may have a single-layer structure or a multi-layer structure having multiple layers.

The electronic device (for example, a light emitting device) may further include i) a color filter, ii) a color conversion layer, or iii) a color filter and a color conversion layer in addition to the light emitting element 10A. The color filter and/or the color conversion layer may be disposed on at least one traveling direction of light emitted from the light emitting element 10A. For example, the light emitted from the light emitting element 10A may be blue light or white light. For a description of the light-emitting element 10A, refer to the above description. According to an embodiment, the color conversion layer may include quantum dots. The quantum dots may be, for example, the quantum dots as described in this specification.

The electronic device may further include a thin film transistor in addition to the above light emitting element 10A. The thin film transistor may include a source electrode, a drain electrode, and an active layer. Any one of the source electrode and the drain electrode of the thin film transistor may be electrically connected to one of the first electrode 110 and the second electrode 190 of the light emitting element 10A.

The thin film transistor may further include a gate electrode and a gate insulating film.

The active layer may include crystalline silicon, amorphous silicon, organic semiconductor, or oxide semiconductor.

The electronic device may further include an encapsulation unit for encapsulating the light emitting element 10A. The encapsulation unit may be disposed between the color filter and/or the color conversion layer and the light emitting element 10A. The encapsulation unit allows light from the light emitting element 10A to be extracted to the outside, and at the same time blocks the penetration of outdoor air and moisture into the light emitting element 10A. The encapsulation unit may be an encapsulation substrate including a transparent glass substrate or plastic substrate. The encapsulation unit may be a thin film encapsulation layer including at least one organic layer and/or at least one inorganic layer. When the encapsulation unit is a thin film encapsulation layer, the electronic device may be flexible.

Various functional layers may be disposed on the encapsulation unit according to the use of the electronic device in addition to the color filter and/or the color conversion layer. Examples of the functional layer may include a touch screen layer, a polarizing layer, and an authentication device. The touch screen layer may be a pressure-sensitive touch screen layer, a capacitive touch screen layer, or an infrared touch screen layer.

The authentication device may be, for example, a biometric authentication device that authenticates an individual by using biometric information of a living body (for example, fingertip, pupil, etc.).

The authentication device may further include a biometric information collection unit in addition to the above-described light emitting element 10A.

The electronic device may be applied to various displays, an illuminator, a personal computer (for example, a mobile personal computer), a mobile phone, a digital camera, an electronic notebook, an electronic dictionary, an electronic game machine, and a medical device (for example, an electronic thermometer, a blood pressure monitor, a blood glucose meter, a pulse measuring device, a pulse wave measuring device, an electrocardiogram display device, an ultrasonic diagnostic device, or a display device for endoscope), fish detector, various measuring devices, instruments (for example, instrument s for vehicles, aircrafts, ships), a projector, or the like.

DEFINITION OF TERMS

As used herein, the $C_3$-$C_{60}$ carbocyclic group refers to a cyclic group of 3 to 60 carbon atoms including only carbon as a ring-forming atom, and the $C_1$-$C_{60}$ heterocyclic group refers to a cyclic group of 1 to 60 carbon atoms further including a heteroatom as a ring-forming atom in addition to carbon. Each of the $C_3$-$C_{60}$ carbocyclic group and the $C_1$-$C_{60}$ heterocyclic group may be a monocyclic group having one ring or a polycyclic group in which two or more rings are condensed with each other. For example, the number of ring-forming atoms of the $C_1$-$C_{60}$ heterocyclic group may be 3 to 61.

As used herein, the cyclic group includes both the $C_3$-$C_{60}$ carbocyclic group and the $C_1$-$C_{60}$ heterocyclic group.

As used herein, the π electron-rich $C_3$-$C_{60}$ cyclic group refers to a cyclic group of 3 to 60 carbon atoms not including *—N=*' as a ring-forming moiety, and the π electron-deficient nitrogen-containing $C_1$-$C_{60}$ cyclic group refers to a heterocyclic group of 1 to 60 carbon atoms including *—N=*' as a ring-forming moiety.

For example, the $C_3$-$C_{60}$ carbocyclic group may be i) group T1 or ii) a condensed cyclic group in which two or more groups T1 are condensed with each other (for example, a cyclopentadiene group, adamantane group, norbornane group, benzene group, pentalene group, naphthalene group, azulene group, indacene group, acenaphthylene group, phenalene group, phenanthrene group, anthracene group, fluoranthene group, triphenylene group, pyrene group, chrysene group, perylene group, pentaphene group, heptalene group, naphthacene group, picene group, hexacene group, pentacene group, rubicene group, coronene group, ovalene group, indene group, fluorene group, spiro-bifluorene group, benzofluorene group, indenophenanthrene group, or indenoanthracene group).

The $C_1$-$C_{60}$ heterocyclic group may be i) group T2, ii) a condensed cyclic group in which two or more groups T2 are condensed with each other, or iii) a condensed cyclic group in which one or more groups T2 and one or more groups T1 are condensed with each other (for example, a pyrrole group, thiophene group, furan group, indole group, benzoindole group, naphthoindole group, isoindole group, benzoisoindole group, naphthoisoindole group, benzosilole group, benzothiophene group, benzofuran group, Carbazole group, dibenzosilole group, dibenzothiophene group, dibenzofuran group, indenocarbazole group, indolocarbazole group, benzofurocarbazole group, benzothienocarbazole group, benzosilolocarbazole group, benzoindolocarbazole group, benzocarbazole group, benzonaphthofuran group, benzonaphthothiophene group, benzonaphthosilole group, benzofurodibenzofuran group, benzofurodibenzothiophene group, benzothienodibenzothiophene group, pyrazole group, imidazole group, triazole group, oxazole group, isoxazole group, oxadiazole group, thiazole group, isothiazole group, thiadiazole group, benzopyrazole group, benzimidazole group, benzoxazole group, benzoisoxazole group, benzothiazole group, benzoisothiazole group, pyridine group, pyrimidine group, pyrazine group, pyridazine group, triazine group, quinoline group, isoquinoline group, benzoquinoline group, benzoisoquinoline group, quinoxaline group, benzoquinoxaline group, quinazoline group, benzoquinazoline group, phenanthroline group, sinoline group, phthalazine group, naphthyridine group, imidazopyridine group, Imidazopyrimidine group, imidazotriazine group, imidazopyrazine group, imidazopyridazine group, azacarbazole group, azafluorene group, azadibenzosilol group, azadibenzothiophene group, or azadibenzofuran group).

The π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which one or more groups T3 and one or more groups T1 are condensed with each other (for example, the $C_3$-$C_{60}$ carbocyclic group, a 1H-pyrrole group, silole group, borole group, 2H-pyrrole group, 3H-pyrrole group, thiophene group, furan group, indole group, benzoindole group, naphthoindole group, isoindole group, benzoisoindole group, naphthoisoindole group, benzosilole group, benzothiophene group, benzofuran group, carbazole group, dibenzosilole group, dibenzothiophene group, dibenzofuran group, indenocarbazole group, indolocarbazole group, benzofurocarbazole group, benzothienocarbazole group, benzosilolocarbazole group, benzoindolocarbazole group, benzocarbazole group, benzonaphthofuran group, benzonaphthothiophene group, benzonaphthosilole group, benzofurodibenzofuran group, benzofurodibenzothiophene group, or benzothienodibenzothiophene group).

The π electron-deficient nitrogen-containing $C_1$-$C_{60}$ cyclic group may be i) group T4, ii) a condensed cyclic group in which two or more groups T4 are condensed with each other, iii) a condensed cyclic group in which one or more groups T4 and one or more groups T1 are condensed with each other, iv) a condensed cyclic group in which one or more groups T4 and one or more groups T3 are condensed with each other, or v) a condensed cyclic group in which one or more groups T4, one or more groups T1, and one or more groups T3 are condensed with each other (for example, a pyrazole group, imidazole group, triazole group, oxazole group, isoxazole group, oxadiazole group, thiazole group, isothiazole group, thiadiazole group, benzopyrazole group, benzimidazole group, benzoxazole group, benzoisoxazole group, benzothiazole group, benzoisothiazole group, pyridine group, pyrimidine group, pyrazine group, pyridazine group, triazine group, quinoline group, isoquinoline group, benzoquinoline group, benzoisoquinoline group, quinoxaline group, benzoquinoxaline group, quinazoline group, benzoquinazoline group, phenanthroline group, sinoline group, phthalazine group, naphthyridine group, imidazopyridine group, Imidazopyrimidine group, imidazotriazine group, imidazopyrazine group, imidazopyridazine group, azacarbazole group, azafluorene group, azadibenzosilol group, azadibenzothiophene group, or azadibenzofuran group.

The group T1 may be a cyclopropane group, cyclobutane group, cyclopentane group, cyclohexane group, cycloheptane group, cyclooctane group, cyclobutene group, cyclopentene group, cyclopentadiene group, cyclohexene group, cyclohexadiene group, cycloheptene group, adamantane group, norbornane (or bicyclo[2.2.1]heptane) group, norbornene group, bicyclo[1.1.1] pentane (bicyclo[1.1.1] pentane) group, bicyclo[2.1.1] hexane (bicyclo[2.1.1] hexane) group, bicyclo[2.2.2] octane group, or benzene group.

The group T2 may be a furan group, thiophene group, 1H-pyrrole group, silole group, borole group, 2H-pyrrole group, 3H-pyrrole group, imidazole group, pyrazole group, triazole group, tetrazole group, oxazole group, isoxazole group, oxadiazole group, thiazole group, isothiazole group, thiadiazole group, azacilole group, azaborole group, pyridine group, pyrimidine group, pyrazine group, pyridazine group, triazine group, tetrazine group, pyrrolidine group, imidazolidine group, dihydropyrrole group, or piperidine group.

The group T3 may be a furan group, a thiophene group, a 1H-pyrrole group, a silole group, or a borole group.

The group T4 may be a 2H-pyrrole group, 3H-pyrrole group, imidazole group, pyrazole group, triazole group, tetrazole group, oxazole group, isoxazole group, oxadiazole group, thiazole group, isothiazole group, thiadiazole group, azasilole group, azaborole group, pyridine group, pyrimidine group, pyrazine group, pyridazine group, triazine group, or tetrazine group.

As used herein, the term "cyclic group", "$C_3$-$C_{60}$ carbocyclic group", "$C_1$-$C_{60}$ heterocyclic group", "T1 electron-rich $C_3$-$C_{60}$ cyclic group", or "T1 electron-deficient nitrogen-containing $C_1$-$C_{60}$ cyclic group" may be a group condensed into an arbitrary cyclic group, a monovalent group, or a multivalent group (for example, bivalent group, trivalent group, or tetravalent group) depending on the structure of the chemical formula in which the term is used. For example, the "benzene group" may be a benzo group, a phenyl group, or a phenylene group, which may be easily understood by those skilled in the art, depending on the structure of the chemical formula including the "benzene group".

For example, examples of the monovalent $C_3$-$C_{60}$ carbocyclic group and the monovalent $C_1$-$C_{60}$ heterocyclic group may include a C3-C10 cycloalkyl group, $C_1$-$C_{10}$ heterocycloalkyl group, $C_3$-$C_{10}$ cycloalkenyl group, $C_1$-$C_{10}$ heterocycloalkenyl group, $C_6$-$C_{60}$ aryl group, $C_1$-$C_{60}$ heteroaryl group, monovalent non-aromatic condensed polycyclic group, and monovalent non-aromatic heterocondensed polycyclic group, and examples of the divalent $C_3$-$C_{60}$ carbocyclic group and the divalent $C_1$-$C_{60}$ heterocyclic group may include a $C_3$-$C_{10}$ cycloalkylene group, $C_1$-$C_{10}$ heterocycloalkylene group, $C_3$-$C_{10}$ cycloalkenylene group, heterocycloalkenylene group, $C_6$-$C_{60}$ arylene group, $C_1$-$C_{60}$ heteroarylene group, divalent non-aromatic condensed polycyclic group, and substituted or unsubstituted divalent non-aromatic hetero condensed polycyclic group.

As used herein, the $C_1$-$C_{60}$ alkyl group refers to a linear or branched aliphatic hydrocarbon monovalent group of 1 to 60 carbon atoms, and examples thereof may include a methyl group, ethyl group, n-propyl group, isopropyl group, n-butyl group, sec-butyl group, isobutyl group, tert-butyl group, n-pentyl group, tert-pentyl group, neopentyl group, isopentyl group, sec-pentyl group, 3-pentyl group, sec-isopentyl group, n-hexyl group, isohexyl group, sec-hexyl group, tert-hexyl group, n-heptyl group, isoheptyl group, sec-heptyl group, tert-heptyl group, n-octyl group, isooctyl group, sec-octyl group, tert-octyl group, n-nonyl group, isononyl group, sec-nonyl group, tert-nonyl group, n-decyl group, isodecyl group, sec-decyl group, and tert-decyl group. As used herein, the $C_1$-$C_{60}$ alkylene group refers to a divalent group having the same structure as the $C_1$-$C_{60}$ alkyl group.

As used herein, the $C_2$-$C_{60}$ alkenyl group refers to a monovalent hydrocarbon group containing one or more carbon-carbon double bonds in the middle or end of a $C_2$-$C_{60}$ alkyl group, and examples thereof may include an ethenyl group, a prophenyl group, and a butenyl group. As used herein, the $C_2$-$C_{60}$ alkenylene group refers to a divalent group having the same structure as the $C_2$-$C_{60}$ alkenyl group.

As used herein, the $C_2$-$C_{60}$ alkynyl group refers to a monovalent hydrocarbon group containing one or more carbon-carbon triple bonds in the middle or end of the $C_2$-$C_{60}$ alkyl group, and examples thereof may include an ethynyl group and a propynyl group. As used herein, the $C_2$-$C_{60}$ alkynylene group refers to a divalent group having the same structure as the $C_2$-$C_{60}$ alkynyl group.

As used herein, the $C_1$-$C_{60}$ alkoxy group refers to a monovalent group having the formula —$OA_{101}$ (here, $A_{101}$ is the above-described $C_1$-$C_{60}$ alkyl group), and examples thereof include a methoxy group, an ethoxy group, and an isopropyloxy group.

As used herein, the $C_3$-$C_{10}$ cycloalkyl group refers to a monovalent saturated hydrocarbon cyclic group of 3 to 10 carbon atoms, and examples thereof may include a cyclopropyl group, a cyclobutyl group, a cyclopentyl group, a cyclohexyl group, a cycloheptyl group, a cyclooctyl group, adamantanyl group, norbornanyl group (or bicyclo[2.2.1]heptyl group (bicyclo[2.2.1]heptyl), bicyclo[1.1.1]pentyl group (bicyclo[1.1.1]pentyl), and bicyclo[2.1.1]hexyl group (bicyclo[2.1.1]hexyl), bicyclo[2.2.2]octyl group. As used herein, the $C_3$-$C_{10}$ cycloalkylene group refers to a divalent group having the same structure as the C3-C10 cycloalkyl group.

As used herein, the $C_1$-$C_{10}$ heterocycloalkyl group refers to a monocyclic group of 1 to 10 carbon atoms further including at least one heteroatom as a ring-forming atom in addition to carbon atom, and examples thereof may include 1,2,3,4-oxatriazolidinyl group (1,2,3,4-oxatriazolidinyl), and tetrahydrofuranyl group, tetrahydrothiophenyl group. As used herein, the $C_1$-$C_{10}$ heterocycloalkylene group refers to a divalent group having the same structure as the $C_1$-$C_{10}$ heterocycloalkyl group.

As used herein, the $C_3$-$C_{10}$ cycloalkenyl group is a monovalent cyclic group of 3 to 10 carbon atoms, and refers to a group having at least one carbon-carbon double bond in the ring, but not having aromaticity, and examples thereof may include a cyclopentenyl group, a cyclohexenyl group, and a cycloheptenyl group. As used herein, the $C_3$-$C_{10}$ cycloalkenylene group refers to a divalent group having the same structure as the $C_3$-$C_{10}$ cycloalkenyl group.

As used herein, the $C_1$-$C_{10}$ heterocycloalkenyl group is a monovalent cyclic group of 1 to 10 carbon atoms further containing at least one heteroatom as a ring-forming atom in addition to carbon atoms, and has at least one double bond in the ring thereof. Examples of the $C_1$-$C_{10}$ heterocycloalkenyl group may include 4,5-dihydro-1,2,3,4-oxatriazolyl group, 2,3-dihydrofuranyl group, and 2,3-dihydrothiophenyl group. As used herein, the $C_1$-$C_{10}$ heterocycloalkenylene group refers to a divalent group having the same structure as the $C_1$-$C_{10}$ heterocycloalkenyl group.

As used herein, the $C_6$-$C_{60}$ aryl group refers to a monovalent group having a carbocyclic aromatic system of 6 to 60 carbon atoms, and the $C_6$-$C_{60}$ arylene group refers to a divalent group having a carbocyclic aromatic system of 6 to 60 carbon atoms. Examples of the $C_6$-$C_{60}$ aryl group may include a phenyl group, pentalenyl group, naphthyl group, azulenyl group, indacenyl group, acenaphthyl group, phenalenyl group, phenanthrenyl group, anthracenyl group, fluoranthenyl group, triphenylenyl group, pyrenyl group, chrysenyl group, perylenyl group, pentaphenyl group, heptalenyl group, naphthacenyl group, pisenyl group, hexaenyl group, pentacenyl group, rubicenyl group, coronenyl group, and ovalenyl group. When the $C_6$-$C_{60}$ aryl group and the $C_6$-$C_{60}$ arylene group include two or more rings, the two or more rings may be condensed with each other.

As used herein, the $C_1$-$C_{60}$ heteroaryl group refers to a monovalent group further containing at least one heteroatom as a ring-forming atom in addition to carbon atom and having a heterocyclic aromatic system of 1 to 60 carbon atoms, and the $C_1$-$C_{60}$ heteroarylene group refers to a divalent group further containing at least one heteroatom as a ring-forming atom in addition to carbon atoms and having a heterocyclic aromatic system of 1 to 60 carbon atoms. Examples of the $C_1$-$C_{60}$ heteroaryl group may include pyridinyl group, pyrimidinyl group, pyrazinyl group, pyridazinyl group, triazinyl group, quinolinyl group, benzoquinolinyl group, isoquinolinyl group, benzoisoquinolinyl group, quinoxalinyl group, benzoquinoxalinyl group, quinazolinyl group, benzoquinazolinyl group, sinolinyl group, phenanthrolinyl group, phthalazinyl group, and naphthyridinyl group. When the $C_1$-$C_{60}$ heteroaryl group and the $C_1$-$C_{60}$ heteroarylene group contain two or more rings, the two or more rings may be condensed with each other.

As used herein, the monovalent non-aromatic condensed polycyclic group is a monovalent group (for example, having 8 to 60 carbon atoms) in which two or more rings are condensed with each other, which contains only carbon as a ring-forming atom, and in which the entire molecule has non-aromaticity. Examples of the monovalent non-aromatic condensed polycyclic group may include an indenyl group, fluorenyl group, spiro-bifluorenyl group, benzofluorenyl group, indenophenanthrenyl group, and indenoanthracenyl group. As used herein, the divalent non-aromatic condensed polycyclic group refers to a divalent group having the same structure as the monovalent non-aromatic condensed polycyclic group.

As used herein, the monovalent non-aromatic condensed heteropolycyclic group is a monovalent group (for example, having 8 to 60 carbon atoms) in which two or more rings are condensed with each other, which contains at least one heteroatom as a ring-forming atom in addition to carbon atom, and in which the entire molecule has non-aromaticity. Examples of the monovalent non-aromatic condensed heteropolycyclic group may include a pyrrolyl group, thiophenyl group, furanyl group, indolyl group, benzoindolyl group, naphthoindolyl group, isoindolyl group, benzoisoindolyl group, naphthoisoindolyl group, benzosilolyl group, benzothiophenyl group, benzofuranyl group, carbazolyl group, dibenzosilolyl group, dibenzothiophenyl group, dibenzofuranyl group, azacarbazolyl group, azafluorenyl group, azadibenzosilolyl group, azadibenzothiophenyl group, azadibenzofuranyl group, pyrazolyl group, imidazolyl, triazolyl, tetrazolyl group, oxazolyl group, isoxazolyl group, thiazolyl group, isothiazolyl group, oxadiazolyl group, thiadiazolyl group, benzopyrazolyl group, benzoimidazolyl group, benzoxazolyl group, benzothiazolyl group, benzoxadiazolyl group, benzothiadiazolyl group, imidazopyridinyl group, imidazopyrimidinyl group, imidazotriazinyl group, imidazopyrazinyl group, imidazopyridazinyl group, indenocarbazolyl group, indolocarbazolyl group, benzofurocarbazolyl group, benzothienocarbazolyl group, benzosilolocarbazolyl group, benzoindolocarbazolyl group, benzocarbazolyl group, benzonaphthofuranyl group, benzonaphthothiophenyl group, benzonaphthosilolyl group, benzofurodibenzofuranyl group, benzofurodibenzothiophenyl group, and benzothienodibenzothiophenyl group. As used herein, the divalent non-aromatic condensed heteropolycyclic group refers to a divalent group having the same structure as the monovalent non-aromatic condensed heteropolycyclic group.

As used herein, the $C_6$-$C_{60}$ aryloxy group indicates —$OA_{102}$ (wherein $A_{102}$ is the above-described $C_1$-$C5_{60}$ aryl group), and the $C_6$-$C_{60}$ arylthio group indicates —$SA_{103}$ (wherein $A_{103}$ is the above-described $C_6$-$C_{60}$ aryl group).

As used herein, the $C_7$-$C_{60}$ arylalkyl group indicates -$A_{104}A_{105}$ (wherein $A_{104}$ is a $C_1$-$C_{54}$ aryl group, and $A_{105}$ is a $C_6$-$C_{59}$ aryl group), and the $C_2$-$C_{60}$ heteroarylalkyl group indicates -$A_{106}A_{107}$ (wherein $A_{106}$ is a $C_1$-$C_{59}$ alkylene group, and $A_{107}$ is a $C_6$-$C_{59}$ heteroaryl group).

As used herein, "$R_{10a}$" may be deuterium (-D), —F, —Cl, —Br, —I, hydroxyl group, cyano group, or nitro group; $C_1$-$C_{60}$ alkyl group, $C_2$-$C_{60}$ alkenyl group, $C_2$-$C_{60}$ alkynyl group, or $C_1$-$C_{60}$ alkoxy group, which is substituted or unsubstituted with deuterium (-D), —F, —Cl, —Br, —I, hydroxyl group, cyano group, nitro group, $C_3$-$C_{60}$ carbocyclic group, $C_1$-$C_{60}$ heterocyclic group, $C_6$-$C_{60}$ aryloxy group, $C_6$-$C_{60}$ arylthio group, $C_7$-$C_{60}$ arylalkyl group, $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof; $C_3$-$C_{60}$ carbocyclic group, $C_1$-$C_{60}$ heterocyclic group, $C_6$-$C_{60}$ aryloxy group, $C_6$-$C_{60}$ arylthio group, $C_7$-$C_{60}$ arylalkyl group, or $C_2$-$C_{60}$ heteroarylalkyl group, which is substituted or unsubstituted with deuterium (-D), —F, —Cl, —Br, —I, hydroxyl group, cyano group, nitro group, $C_1$-$C_{60}$ alkyl group, $C_2$-$C_{60}$ alkenyl group, $C_2$-$C_{60}$ alkynyl group, $C_1$-$C_{60}$ alkoxy group, $C_3$-$C_{60}$ carbocyclic group, $C_1$-$C_{60}$ heterocyclic group, $C_6$-$C_{60}$ aryloxy group, $C_6$-$C_{60}$ arylthio group, $C_7$-$C_{60}$ arylalkyl group, $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

As used herein, $Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —C; —Br, —I; hydroxyl group; cyano group; nitro group; $C_1$-$C_{60}$ alkyl group; $C_2$-$C_{60}$ alkenyl group; $C_2$-$C_{60}$ alkynyl group; or $C_1$-$C_{60}$ alkoxy group; $C_3$-$C_{60}$ carbocyclic group substituted or unsubstituted with deuterium, —F, $C_1$-$C_{60}$ alkyl group, $C_1$-$C_{60}$ alkoxy group, phenyl group, biphenyl group, or any combination thereof; $C_1$-$C_{60}$ heterocyclic group; $C_7$-$C_{60}$ arylalkyl group; or $C_2$-$C_{60}$ heteroarylalkyl group.

As used herein, the heteroatom refers to any atom except for carbon atom. The heteroatom includes O, S, N, P, Si, B, Ge, Se, or any combination thereof.

As used herein, the third-row transition metal includes hafnium (Hf), tantalum (Ta), tungsten (W), rhenium (Re), osmium (Os), iridium (Ir), platinum (Pt), and gold (Au).

As used herein, the "Ph" refers to a phenyl group, "Me" refers to a methyl group, the "Et" refers to an ethyl group, the "ter-Bu" or "But" refers to a tert-butyl group, and the "OMe" refers to a methoxy group.

As used herein, the "biphenyl group" refers to a "phenyl group substituted with a phenyl group". The "biphenyl group" belongs to a "substituted phenyl group" in which the substituent is a "$C_6$-$C_{60}$ aryl group".

As used herein, the "terphenyl group" refers to "phenyl group substituted with biphenyl group". The "terphenyl group" belongs to a "substituted phenyl group" in which the substituent is a "$C_6$-$C_{60}$ aryl group substituted with a $C_6$-$C_{60}$ aryl group".

As used herein, unless otherwise defined, * and *' each refer to a bonding site of a chemical formula or moiety with a neighboring atom.

Hereinafter, the quantum dot according to an embodiment, and the method of preparing the same will be described in detail with reference the following Examples.

EXAMPLES

Synthesis Example 1 (Synthesis of Quantum Dot 1)

Step 1: Synthesis of InP Particles 1.0 mmol of $InCl_3$ and 5 g of oleyl amine were put into a three-neck flask, mixed, and degassed and stirred at 100° C. for 120 minutes to remove oxygen and moisture, to prepare a reaction solution. Thereafter, the reaction solution was heated to 290° C. under an argon atmosphere, maintained for a certain period of time, and cooled to 220° C. 0.25 mmol of $P(N(CH_3)_2)$ was rapidly injected into the reaction solution, and this reaction solution was reacted for a certain period of time to synthesize InP particles having an average diameter (D50) of 1.5 nm.

Step 2: Synthesis of $In_{1-x}Ga_xP$ core particle (x=0.3)

0.45 mmol of the InP particles, 0.68 mmol of $GaI_3$, and 1.36 mmol of oleyl amine were mixed, reacted at 280° C. for 4 minutes, and refined to synthesize an $In_{1-x}Ga_xP$ core particle (x=0.3) having a first region and a second region, as described in this specification.

Step 3: Synthesis of $In_{1-x}GaxP/ZnSe/ZnS$ (x=0.3) Quantum Dot 1

A ZnSe/ZnS shell was formed on the surface of the $In_{1-x}Ga_xP$ core particle (x=0.3) to synthesize $In_{1-x}Ga_xP/ZnSe/ZnS$ (x=0.3) quantum dot 1 (hereinafter, referred to as "QD-1") having an average particle diameter (D50) of 2 nm.

Synthesis Example 2 (Synthesis of Quantum Dot 2)

$In_{1-x}Ga_xP/ZnSe/ZnS$ (x=0.5) quantum dot 2 (hereinafter, referred to as "QD-2") was synthesized in the same manner in Synthesis Example 1, except that the amount of $GaI_3$ used was changed to 0.90 mmol in Step 2.

Synthesis Example 3 (Synthesis of Quantum Dot 3)

$In_{1-x}Ga_xP/ZnSe/ZnS$ (x=0.7) quantum dot 3 (hereinafter, referred to as "QD-3") was synthesized in the same manner in Synthesis Example 1, except that the amount of $GaI_3$ used was changed to 1.35 mmol in Step 2.

Comparative Synthesis Example a (Synthesis of Quantum Dot A)

InP/ZnSe/ZnS quantum dot A (hereinafter, referred to as "QD-A") was synthesized in the same manner in Synthesis Example 1, except that Step 2 was omitted.

Comparative Synthesis Example B (Synthesis of Quantum Dot B)

$In_{1-x}Ga_xP$/ZnSe/ZnS (x=0.3) quantum dot B (hereinafter, referred to as "QD-B") was synthesized in the same manner in Synthesis Example 1, except that the reaction temperature in Step 2 was changed to 380° C.

Comparative Synthesis Example C (Synthesis of Quantum Dot C)

$In_{1-x}Ga_xP$/ZnSe/ZnS (x=0.3) quantum dot C (hereinafter, referred to as "QD-C") was synthesized in the same manner in Synthesis Example 1, except that the reaction temperature in Step 2 was changed to 200° C.

Evaluation Example 1

Structures of QD-1 (cation exchange reaction temperature=280° C.), QD-B (cation exchange reaction temperature=380° C.) and QD-C(cation exchange reaction temperature=200° C.) were observed by using an EDX profiling using a TEM device under a vacuum atmosphere.

As a result, it may be found that:
1) the QD-1 (cation exchange reaction temperature=280° C.) has a structure including a first region and a second region as described in this specification,
2) the QD-B (cation exchange reaction temperature=380° C.) has a structure in which In and Ga are uniformly dispersed in the entire quantum dot B, and
3) the QD-C(cation exchange reaction temperature=200° C.) has a structure not including a region in which In and Ga are alloyed with each other, and as such, the structure does not include a second region as described in the specification.

Based on the above Evaluation Example 1, the compositions and structures of QD-1, QD-2, QD-3, QD-A, QD-B, and QD-C are summarized in Table 1.

TABLE 1

| Quantum dot | Amount of GaI$_3$ used (mmol) | Cation exchange reaction temperature (° C.) | Composition | Structure |
|---|---|---|---|---|
| QD-1 | 0.68 | 280 | $In_{1-x}Ga_xP$/ ZnSe/ZnS (x = 0.3) | 1) $In_{1-x}Ga_xP$ core includes region covering the first region |
| QD-2 | 0.90 | 280 | $In_{1-x}Ga_xP$/ ZnSe/ZnS (x = 0.5) | 2) First region is made of InP, and second region is made of InGaP |
| QD-3 | 1.35 | 280 | $In_{1-x}Ga_xP$/ ZnSe/ZnS (x = 0.7) | |
| QD-A | 0 | — | InP/ZnSe/ ZnS | Ga is not included |
| QD-B | 0.68 | 380 | $In_{1-x}Ga_xP$/ ZnSe/ZnS (x = 0.3) | In and Ga are uniformly dispersed in the entire $In_{1-x}Ga_xP$ core |
| QD-C | 0.68 | 200 | InP/GaP/ ZnSe/ZnS | In and Ga are not alloyed, and thus InGaP is not included |

Evaluation Example 2

Figure 5:
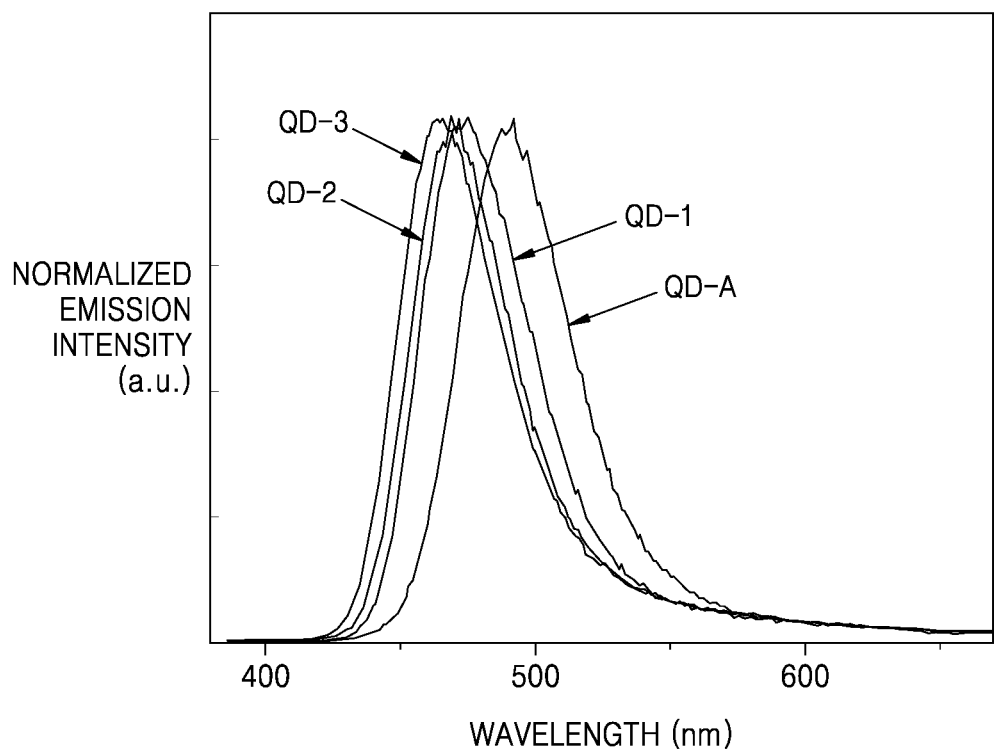
FIG. 5 is a graph illustrating the emission spectra of QD-1, QD-2, QD-3, and QD-A prepared in Synthesis Examples 1 to 3 and Comparative Synthesis Example A.

Maximum emission wavelengths, full width of half maximums (FWHM) and photoluminescent quantum efficiencies of QD-1, QD-2, QD-3, QD-A, QD-B, and QD-C were evaluated by using Quantum Efficiency Measurement System QE-2100 (excitation wavelength: 365 nm, 458 nm) of Otsuka Corporation, and the results thereof are summarized in Table 2. Emission spectra of QD-1, QD-2, QD-3, and QD-A are shown in FIG. 5.

TABLE 2

| Quantum dot | Amount of GaI$_3$ used (mmol) | Cation exchange Reaction temperature (° C.) | Maximum emission wavelength (nm) | Full width of half maximum (nm) | Photo-luminescence quantum yield (%) |
|---|---|---|---|---|---|
| QD-1 | 0.68 | 280 | 475 | 47 | 81 |
| QD-2 | 0.90 | 280 | 469 | 43 | 82 |
| QD-3 | 1.35 | 280 | 465 | 45 | 80 |
| QD-A | 0 | — | 490 | 48 | 68 |
| QD-B | 0.68 | 380 | 510 | 60 | 51 |

From Table 2, it may be found that QD-1, QD-2, and QD-3 have a maximum emission wavelength of 480 nm or less as compared with QD-A and QD-B, and emit blue light having a relatively small full width of half maximum and a photoluminescence quantum yield.

Example 1

A glass substrate provided with an ITO electrode as an anode was cut to a size of 50 mm×50 mm×0.7 mm, ultrasonically cleaned using isopropyl alcohol and pure water for 5 minutes, irradiated with ultraviolet light for 30 minutes, and exposed to ozone to be cleaned, and provided on a vacuum deposition apparatus.

The ITO electrode of the glass substrate was coated with PEDOT: PSS at a coating speed of 3000 rpm for 60 seconds by spin coating, naturally dried at room temperature for 1 minute, and baked at 150° C. for 30 minutes to form a hole injection layer having a thickness of 33 nm. The hole injection layer was coated thereon with PVK at a coating speed of 3000 rpm for 60 seconds by spin coating, naturally dried at room temperature for 1 minute, and baked at 150° C. for 30 minutes to form a hole transport layer having a thickness of 28 nm.

Subsequently, after mixing QD-3 in octane as a solvent at a concentration of 5 mg/ml to prepare a composition for forming an emission layer, the transport injection layer was coated thereon with the composition for forming an emission layer at a coating speed of 3000 rpm for 20 seconds by spin coating, naturally dried at room temperature for 5 minutes, and dried at 70° C. for 10 minutes to form an emission layer having a thickness of 11 nm on the transport layer.

Subsequently, after mixing ZnMgO nanoparticles (particle diameter=3.5 nm to 3.7 nm) in octane as a solvent at a concentration of 30 mg/ml to prepare a composition for forming an electron transport layer, the emission layer was coated thereon with the composition for forming an electron transport layer at a coating speed of 3000 rpm for 60 seconds by spin coating, and baked at 70° C. for 10 minutes to form an electron transport layer having a thickness of 38 nm on the emission layer. Subsequently, Al is deposited on the electron transport layer to form a cathode having a thickness of 100 nm, thereby preparing a light emitting element.

Evaluation Example 3

Figure 6:
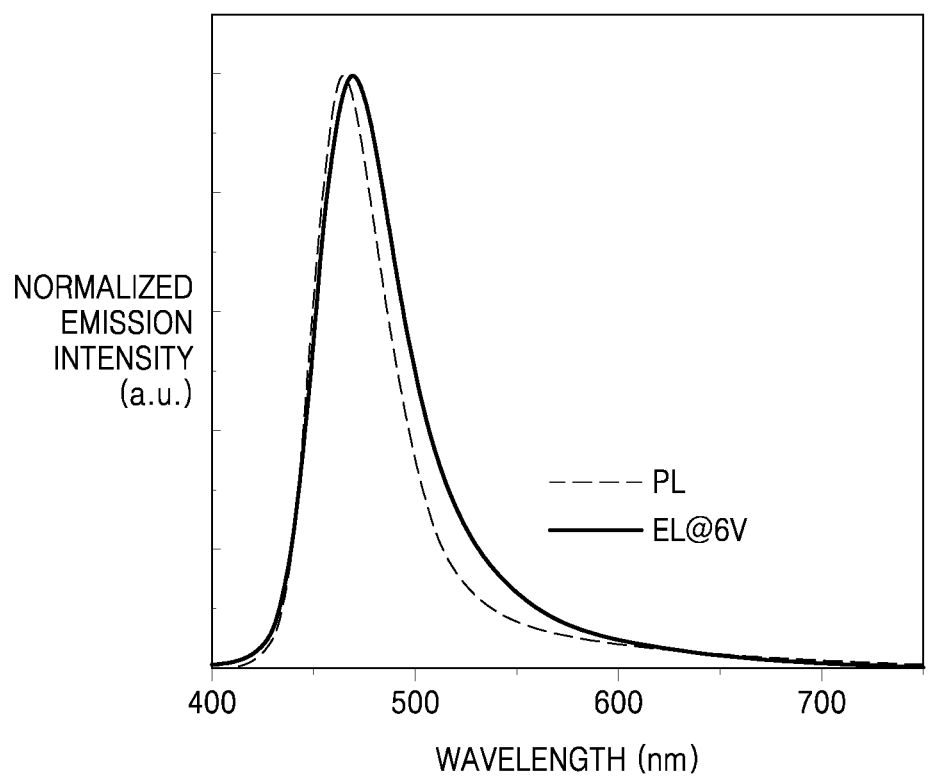
FIG. 6 is a graph illustrating the PL spectrum of the quantum dot QD-3 and the EL spectrum (at 6V) of the light emitting element prepared in Example 1.
Figure 7:
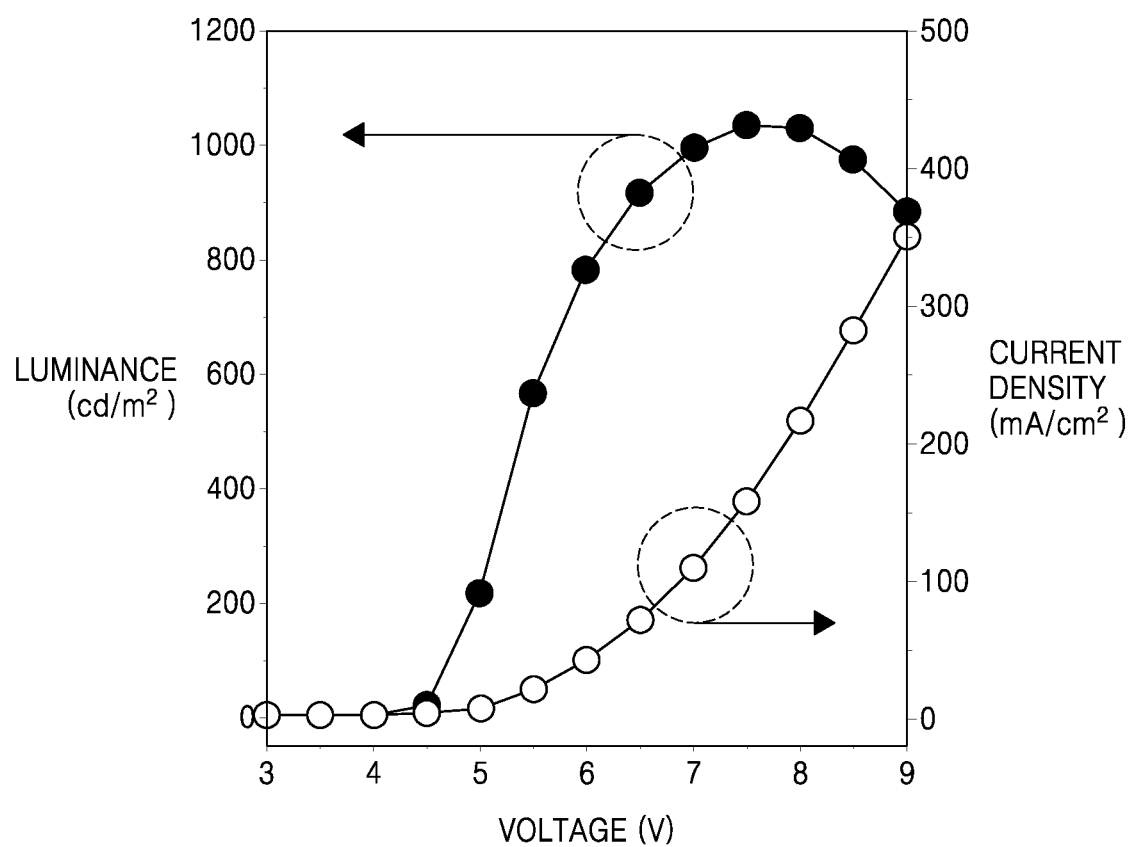
FIG. 7 illustrates a voltage-luminance graph and voltage-current density graph of the light emitting element prepared in Example 1.
Figure 8:
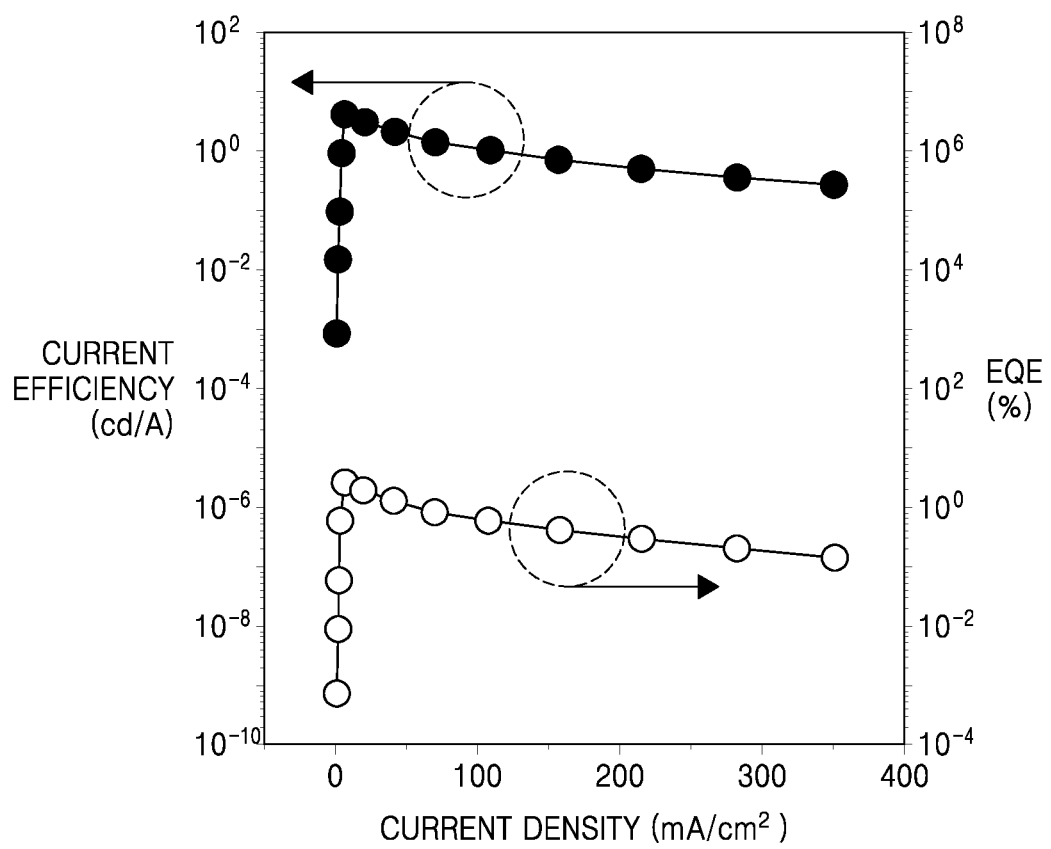
FIG. 8 illustrates a current density-current efficiency graph and current density-external quantum efficiency graph of the light emitting element prepared in Example 1.

The maximum emission wavelength, driving voltage, current density, luminance, current efficiency, and external quantum efficiency of the light emitting element prepared in Example 1 were measured using a current-volt meter (Keithley SMU 236) and a luminance meter (PR650), and the results thereof are shown in Table 3. .i) PL spectrum of the quantum dot QD-3 and EL spectrum of the light emitting element prepared in Example 1 (at 6V), ii) voltage-luminance graph and voltage-current density graph of the light emitting element prepared in Example 1, and iii) current density-current efficiency graph and current density-external quantum efficiency (EQE) graph of the light emitting element prepared in Example 1 are shown in FIGS. 6, 7, and 8.

TABLE 3

| | Quantum dot included in emission layer | Maxim emission wavelength of EL spectrum (at 6 V) (mm) | Driving voltage (V) | Current density (mA/cm$^2$) | Luminance (cd/m$^2$) | Current Efficiency (cd/A) | External Quantum Efficiency (EQE) (%) |
|---|---|---|---|---|---|---|---|
| Example 1 | QD-3 | 469 | 7.5 | 157 | 1038 | 3.8 | 2.5 |

From Table 3, it may be found that the light emitting element of Example 1 has excellent driving voltage, current density, luminance, current efficiency, and external quantum efficiency.

Since the quantum dot is environmentally friendly, emits blue light having a maximum emission wavelength equal to or less than about 490 nm, and has excellent photoluminescence quantum yield (PLQY), a high-quality optical member and a high-quality electronic device, using the quantum dot, may be provided.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:
1. A quantum dot comprising:
a core including indium (In), $A^1$, and $A^2$; and
a shell covering the core, wherein
$A^1$ is a Group V element,
$A^2$ is a Group III element other than indium,
the core includes a first region, and a second region covering the first region,
the first region does not include $A^2$, and includes indium and $A^1$,
the second region includes indium, $A^1$, and $A^2$,
indium and $A^2$ are alloyed with each other in the second region, and the quantum dot emits blue light having a maximum emission wavelength in a range of about 400 nm to about 490 nm.

2. The quantum dot of claim 1, wherein $A^1$ is nitrogen (N), phosphorus (P), arsenic (As), antimony (Sb), bismuth (Bi), or a combination thereof.

3. The quantum dot of claim 1, wherein $A^2$ is boron (B), aluminum (Al), gallium (Ga), thallium (Tl), or a combination thereof.

4. The quantum dot of claim 1, wherein the first region includes InN, InP, InAs, InSb, InNP, InNAs, InNSb, InPAs, or InPSb.

5. The quantum dot of claim 1, wherein the second region includes InGaN, InGaP, InGaAs, InGaSb, InGaNP, InGaNAs, InGaNSb, InGaPAs, InGaPSb, InAlN, InAlP, InAlAs, InAlSb, InAlNP, InAlNAs, InAlNSb, InAlPAs, InAlPSb, InGaAlN, InGaAlP, InGaAlAs, InGaAlSb, InGaAlNP, InGaAlNAs, InGaAlNSb, InGaAlPAs, or InGaAlPSb.

6. The quantum dot of claim 1, wherein $A^2$ is introduced into the second region by a cation exchange reaction.

7. The quantum dot of claim 1, wherein $A^1$ included in the first region is the same as $A^1$ included in the second region.

8. The quantum dot of claim 1, wherein the concentration of $A^2$ included in the second region has a concentration gradient in which the concentration of $A^2$ gradually increases along a direction from an interface between the first region and the second region toward a surface of the core.

9. The quantum dot of claim 1, wherein the shell includes a Group III-V semiconductor compound, a Group II-VI semiconductor compound, or a combination thereof.

10. The quantum dot of claim 9, wherein
the Group III-V semiconductor compound includes GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, and
the Group II-VI semiconductor compound includes ZnS, ZnSe, ZnTe, ZnO, MgS, MgSe, ZnSeS, ZnSeTe, ZnSTe, MgZnS, MgZnSe, or a combination thereof.

11. The quantum dot of claim 9, wherein
the shell includes:
a first shell covering the core; and
a second shell covering the first shell,
the first shell includes GaP, ZnSe, ZnSeS, or a combination thereof, and
the second shell includes ZnS.

12. The quantum dot of claim 1, wherein
the core further includes a third region covering the second region, the third region does not include indium, and
the third region includes $A^1$ and $A^2$.

13. A method of preparing a quantum dot, wherein the quantum dot comprises:
a core including indium (In), $A^1$, and $A^2$; and
a shell covering the core,
$A^1$ is a Group V element,
$A^2$ is a Group III element other than indium,
the core includes a first region and a second region covering the first region,
the first region does not include $A^2$, and includes indium and $A^1$,
the second region includes indium, $A^1$, and $A^2$,
indium and $A^2$ are alloyed with each other in the second region,
the quantum dot emits blue light having a maximum emission wavelength in a range of about 400 nm to about 490 nm, and
the method comprises:
providing a first particle including indium (In) and $A^1$;
forming the core by contacting the first particle with a composition including an $A^2$-containing precursor at a temperature in a range of about 210° C. to about 340° C.; and
forming the shell covering the core.

14. The method of claim 13, wherein the forming of the core includes forming a second region of the core by a cation exchange reaction in which at least indium cations of the first particle are substituted with $A^2$ cations by contacting the first particle with a composition including an $A^2$-containing precursor.

15. The method of claim 13, wherein the $A^2$-containing precursor includes an $A^2$-containing halogenide, an $A^2$-containing oxide, an $A^2$-containing nitride, an $A^2$-containing antimonide, an $A^2$-containing oxynitride, an $A^2$-containing sulfide, an $A^2$-containing oxyhalogenide, an $A^2$-containing oxyhalogenide hydrate, an $A^2$-containing nitrate, an $A^2$-containing nitrate hydrate, an $A^2$-containing sulfate, an $A^2$-containing sulfate hydrate, an $A^2$-containing amine derivative, an $A^2$-containing hydrocarbon derivative, or a combination thereof.

16. An optical member comprising the quantum dot of claim 1.

17. An electronic device comprising the quantum dot of claim 1.

18. The electronic device of claim 17, comprising:
a light source; and
a color conversion member disposed in a path of light emitted from the light source,
wherein the color conversion member includes the quantum dot.

19. The electronic device of claim 17, comprising:
a light-emitting element including a first electrode, a second electrode facing the first electrode, and an emission layer between the first electrode and the second electrode,
wherein the light-emitting element includes the quantum dot.

* * * * *

UNITED STATES PATENT AND TRADEMARK OFFICE
CERTIFICATE OF CORRECTION

| | | |
|---|---|---|
| PATENT NO. | : 11,802,239 B2 | Page 1 of 1 |
| APPLICATION NO. | : 17/203538 | |
| DATED | : October 31, 2023 | |
| INVENTOR(S) | : Ko et al. | |

It is certified that error appears in the above-identified patent and that said Letters Patent is hereby corrected as shown below:

On the Title Page

Item (30), Line 1, the date associated with foreign priority application KR 10-2020-0039263: "Mar. 21, 2020" should be listed as "Mar. 31, 2020".

Signed and Sealed this
Fifth Day of December, 2023

Katherine Kelly Vidal
*Director of the United States Patent and Trademark Office*